United States Patent
Lee et al.

(10) Patent No.: US 10,269,655 B1
(45) Date of Patent: Apr. 23, 2019

(54) SEMICONDUCTOR DEVICE AND METHOD

(71) Applicant: Taiwan Semiconductor Manufacturing Company, Ltd., Hsinchu (TW)

(72) Inventors: Yi-Jung Lee, Hsinchu (TW); Tsung-Hsi Yang, Zhubei (TW); Ming-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/993,252

(22) Filed: May 30, 2018

(51) Int. Cl.
  *H01L 27/092* (2006.01)
  *H01L 21/8238* (2006.01)

(52) U.S. Cl.
  CPC ........... *H01L 21/823814* (2013.01); *H01L 21/823821* (2013.01); *H01L 27/0924* (2013.01)

(58) Field of Classification Search
  None
  See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 * | 7/2015 | Tsai | H01L 21/02521 |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2016/0343815 A1 * | 11/2016 | Wang | H01L 21/82348 |
| 2019/0006507 A1 * | 1/2019 | Ma | H01L 29/785 |

* cited by examiner

*Primary Examiner* — Thien F Tran
(74) *Attorney, Agent, or Firm* — Slater Matsil, LLP

(57) ABSTRACT

An embodiment is a device including a first fin extending from a substrate, a first gate stack over and along sidewalls of the first fin, a first gate spacer disposed along a sidewall of the first gate stack, and a first epitaxial source/drain region in the first fin and adjacent the first gate spacer. The first epitaxial source/drain region including a first epitaxial layer on the first fin, the first epitaxial layer including silicon and carbon, a second epitaxial layer on the first epitaxial layer, the second epitaxial layer having a different material composition than the first epitaxial layer, the first epitaxial layer separating the second epitaxial layer from the first fin, and a third epitaxial layer on the second epitaxial layer, the third epitaxial layer having a different material composition than the first epitaxial layer.

20 Claims, 29 Drawing Sheets

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
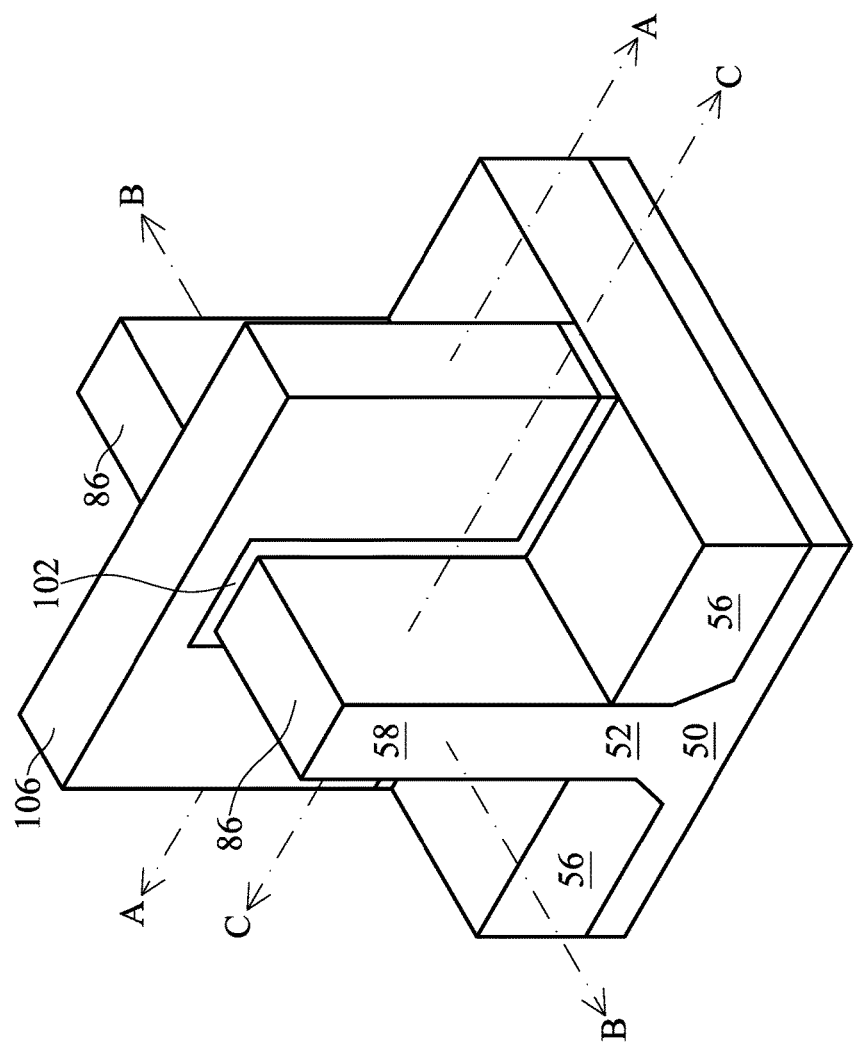
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last (sometimes referred to as replacement gate process) process. In other embodiments, a gate-first process may be used. Some variations of the embodiments are discussed. Also, some embodiments contemplate aspects used in planar devices, such as planar FETs. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to improve the reliability of FinFET devices by widening the process window for the dummy gate removal process. In conventional FinFETs, a defect or break in the sidewall spacer could allow for the etchants used during the removal of the dummy gate to attack and damage the source/drain region. In the disclosed embodiments, the source/drain regions include an outer layer that has a low etch rate to the etchants used during the removal of the dummy gate to protect the source/drain region from being attacked and damaged during the dummy gate removal process. For example, if there were a defect or break in the gate seal spacer and/or gate spacer, the outer layer, which has a low etch rate to the etchants used, would protect the source/drain region from being attacked and damaging the source/drain region during the dummy gate removal process. If the source/drain region were to be damaged during the dummy gate removal process, the subsequent formation of the replacement gate could allow metal of the replacement gate to extrude through the defect in the spacer and into the damaged area of the source/drain region. This extruded gate portion could short the gate to the source/drain region and render the device non-functional. In addition, the epitaxial profile of the source/drain regions can be controlled by the disclosed embodiments. The disclosed processes and structures can improve the reliability and yield of the FinFET device.

Some embodiments contemplate both n-type devices, such as n-type FinFETs, and p-type devices, such as p-type FinFETs, being manufactured during a manufacturing process. Hence, some embodiments contemplate the formation of complementary devices. Figures below may illustrate one device, but one of ordinary skill in the art will readily understand that multiple devices, some with a different device type, can be formed during processing. Some aspects of the formation of complementary devices are discussed below, although such aspects may not necessarily be illustrated in the figures.

FIG. 1 illustrates an example of a FinFET in a three-dimensional view, in accordance with some embodiments. The FinFET comprises a fin 58 on a substrate 50. Isolation regions 56 are formed on the substrate 50, and the fin 58 protrudes above and from between neighboring isolation regions 56. A gate dielectric layer 102 is along sidewalls and over a top surface of the fin 58, and a gate electrode 106 is over the gate dielectric layer 102. Source/drain regions 86 are disposed in opposite sides of the fin 58 with respect to the gate dielectric layer 102 and gate electrode 106. FIG. 1 further illustrates reference cross-sections that are used in later figures. Cross-section A-A is across a channel, gate dielectric layer 102, and gate electrode 106 of the FinFET. Cross-section B-B is perpendicular to cross-section A-A and is along a longitudinal axis of the fin 58 and in a direction of, for example, a current flow between the source/drain regions 86. Cross-section C-C is parallel to cross-section A-A and extends through a source/drain region of the FinFET Subsequent figures refer to these reference cross-sections for clarity.

FIGS. 2-6 are cross-sectional views of intermediate stages in the manufacturing of FinFETs, in accordance with some embodiments. FIGS. 2 through 6 are shown along reference cross-section A-A illustrated in FIG. 1, except for multiple fins/FinFETs.

Figure 2:
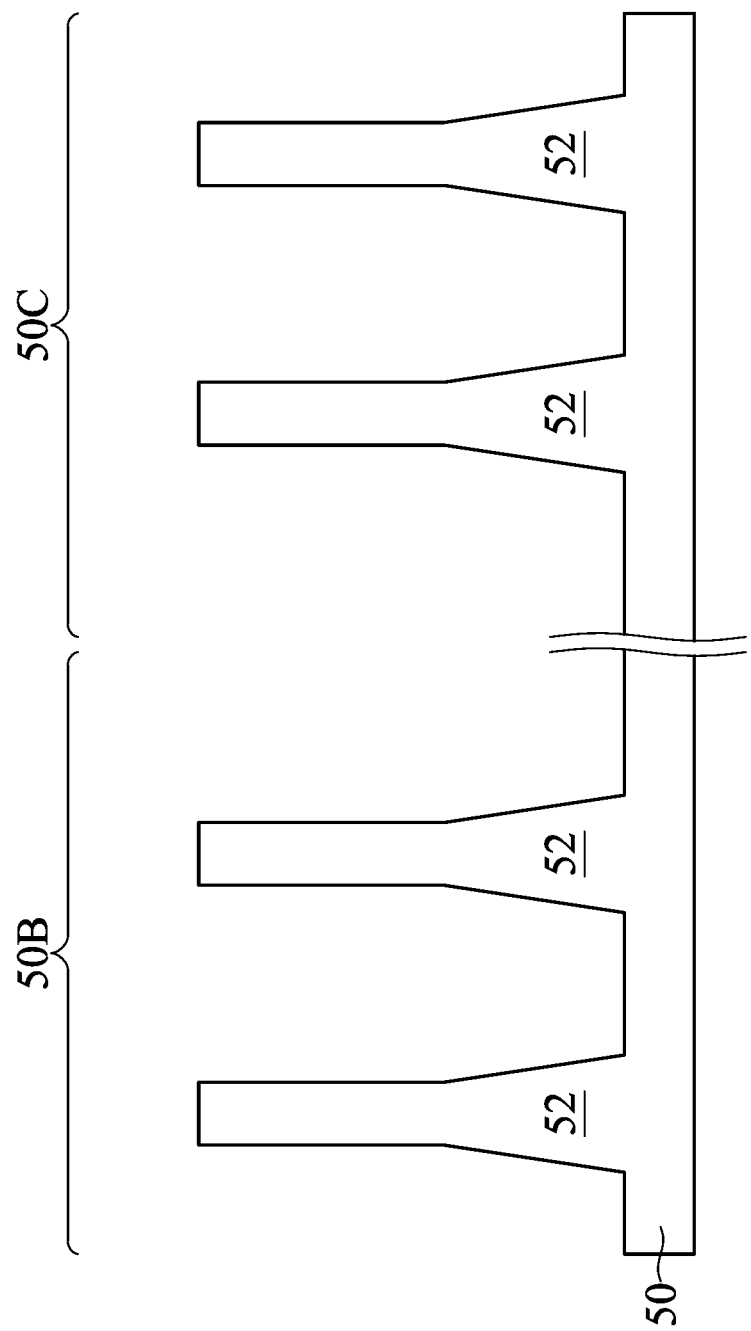
FIGS. 2, 3, 4, 5, 6, 7, 8, 9, 10, 11, 12A, 12B, 12C, 13, 14, 15, 16, 17, 18, 19, 20, 21, and 22 are cross-sectional views of intermediate stages in the manufacturing of FinFETs, in accordance with some embodiments.

In FIG. 2, fins 52 are formed in a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by a divider), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 3:
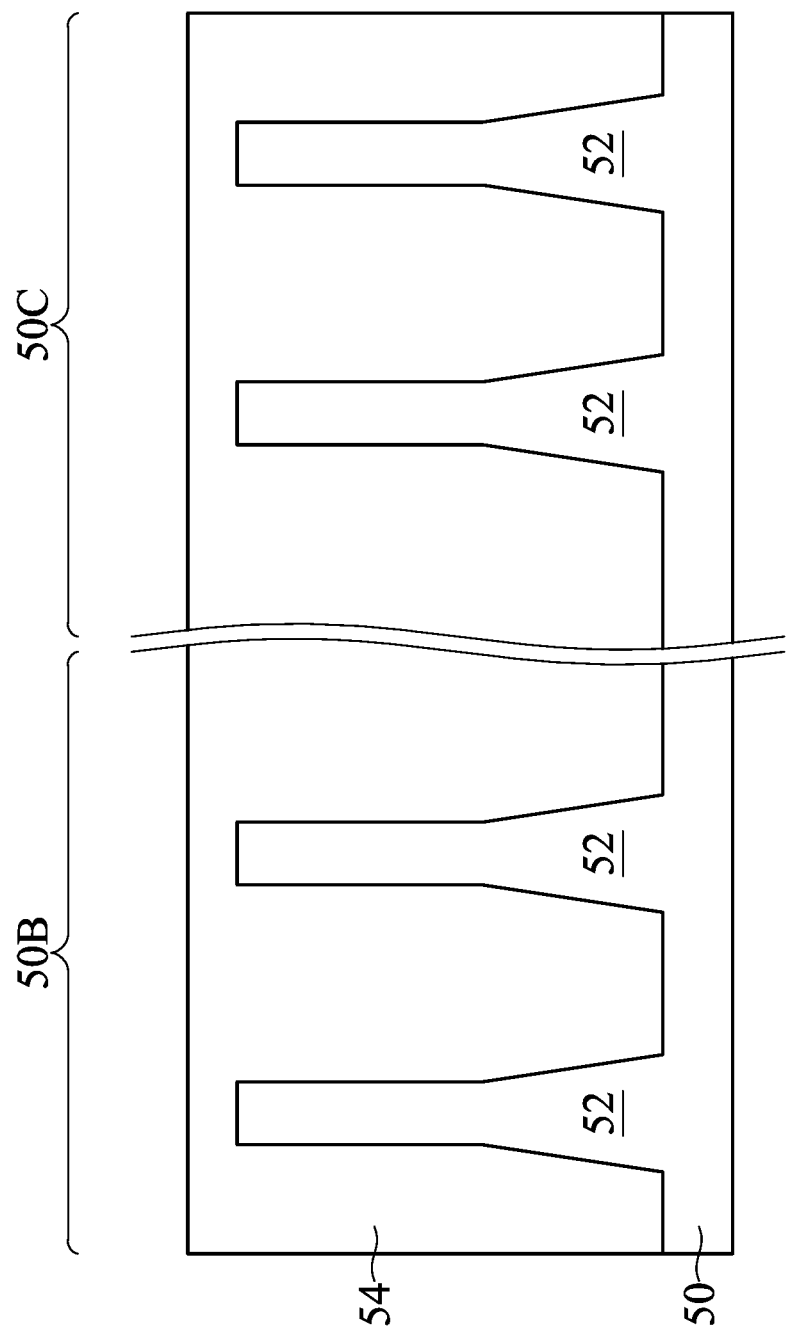

In FIG. 3, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 4:
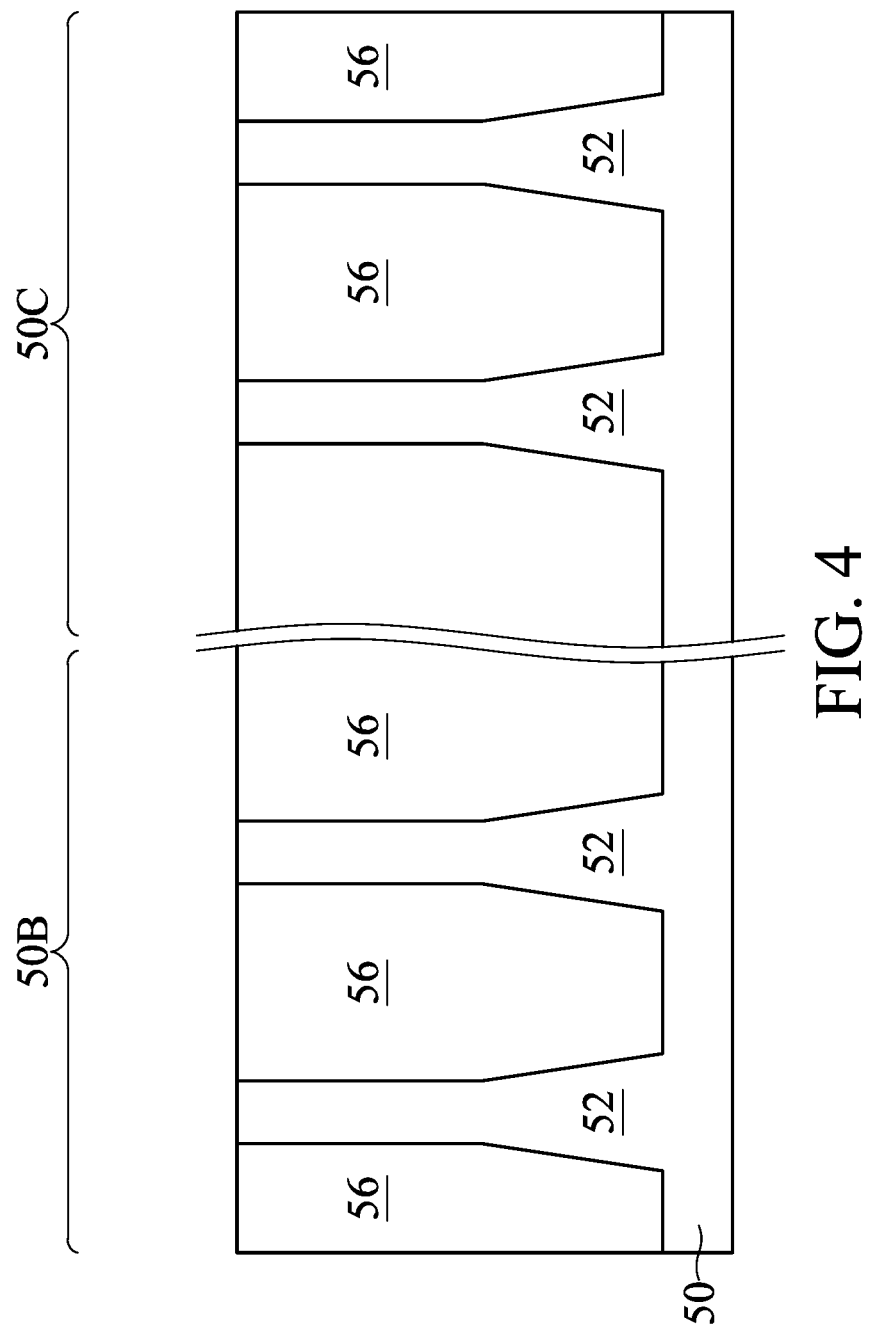

In FIG. 4, a planarization process is applied to the insulation material 54. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process is complete.

Figure 5:
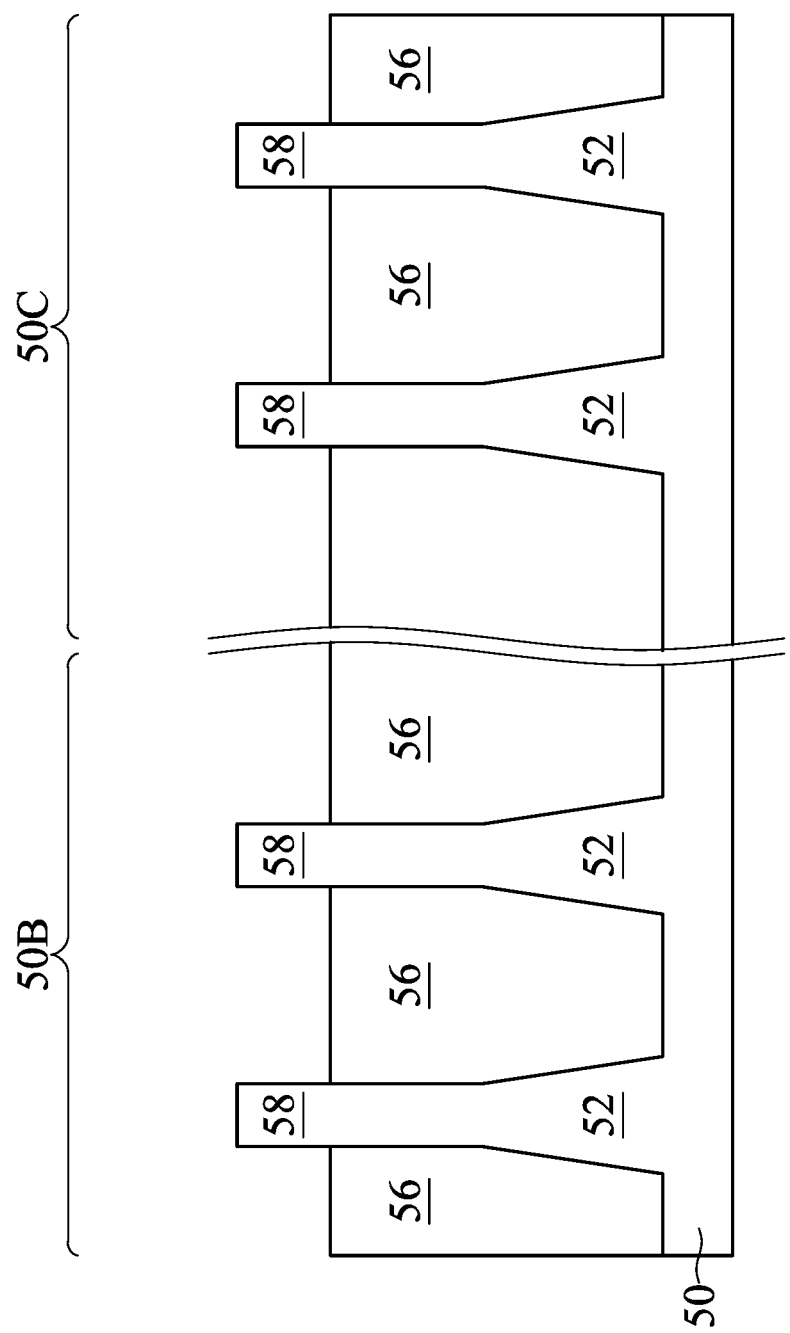

In FIG. 5, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 4 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate doped regions (not shown, sometimes referred to as well regions) may be formed in the fins 58, the fins 52, and/or the substrate 50. In some embodiments, a P-type doped region may be formed in the region 50B, and an N-type doped region may be formed in the region 50C. In some embodiments, only P-type or only N-type doped regions are formed in both the region 50B and the region 50C.

In the embodiments with different types of doped regions, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as from about $10^{17}$ cm$^{-3}$ to about $10^{18}$ cm$^{-3}$. After the implant, the photoresist is removed, such as by an acceptable ashing process. Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, BF2, or the like implanted in the region to a concentration of equal to or less than $10^{18}$ cm$^{-3}$, such as from about $10^{17}$ cm$^{-3}$ to about $10^{18}$ cm$^{-3}$. After the implant, the photoresist may be removed, such as by an acceptable ashing process. After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 6:
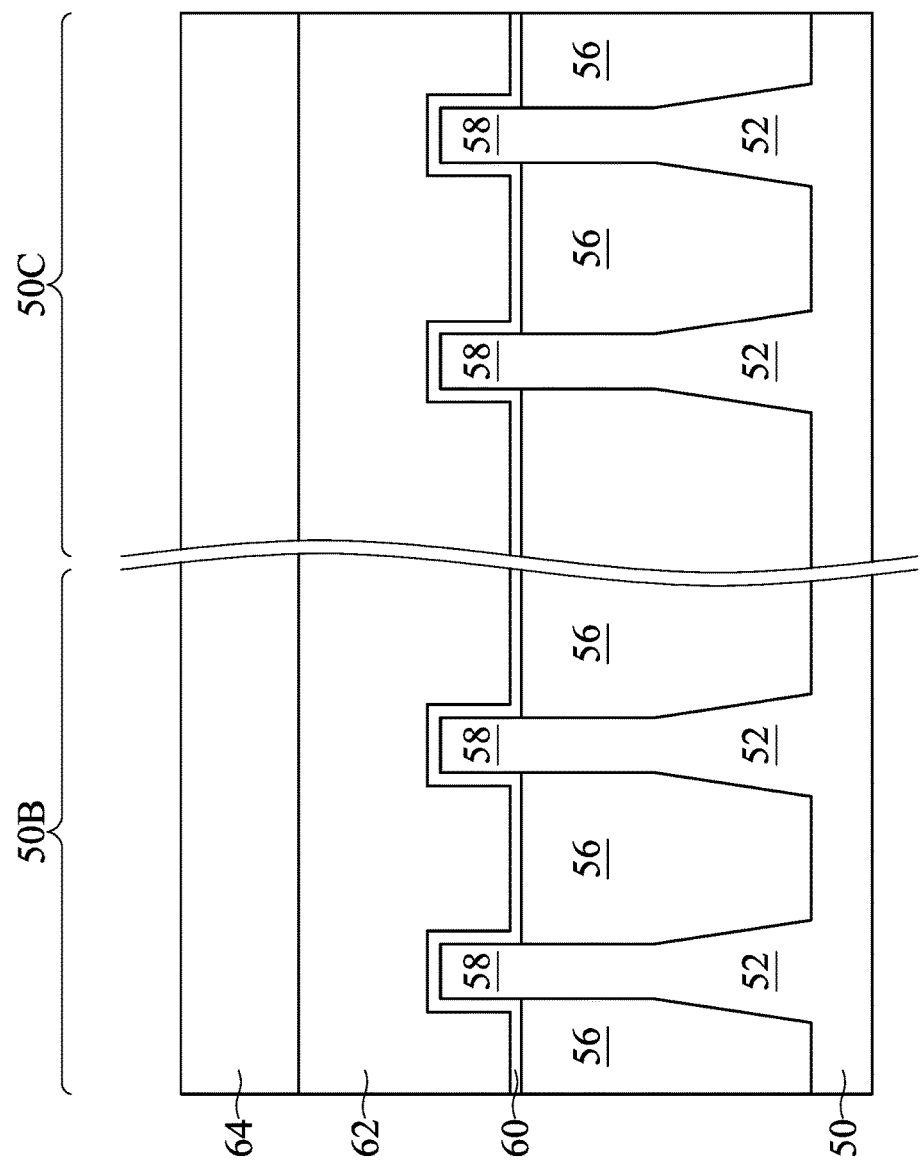

In FIG. 6, a dummy dielectric layer 60 is formed over the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may be deposited over the dummy gate layer 62. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 7-24 are cross-sectional views of intermediate stages in the manufacturing of FinFETs, in accordance with some embodiments. FIGS. 7-12A and 13-24 are shown along reference cross-section B-B illustrated in FIG. 1, except for multiple fins/FinFETs. FIGS. 12B-12C are shown along reference cross-section C-C illustrated in FIG. 1, except for multiple fins/FinFETs.

FIGS. 7-12A and 13-24 illustrate a region 50B and a region 50C of one or more of the fins 58. The regions 50B and 50C may be in the same fin 58 or different fins 58. Devices in the different regions 50B and 50C may be formed to have different threshold voltages.

Figure 7:
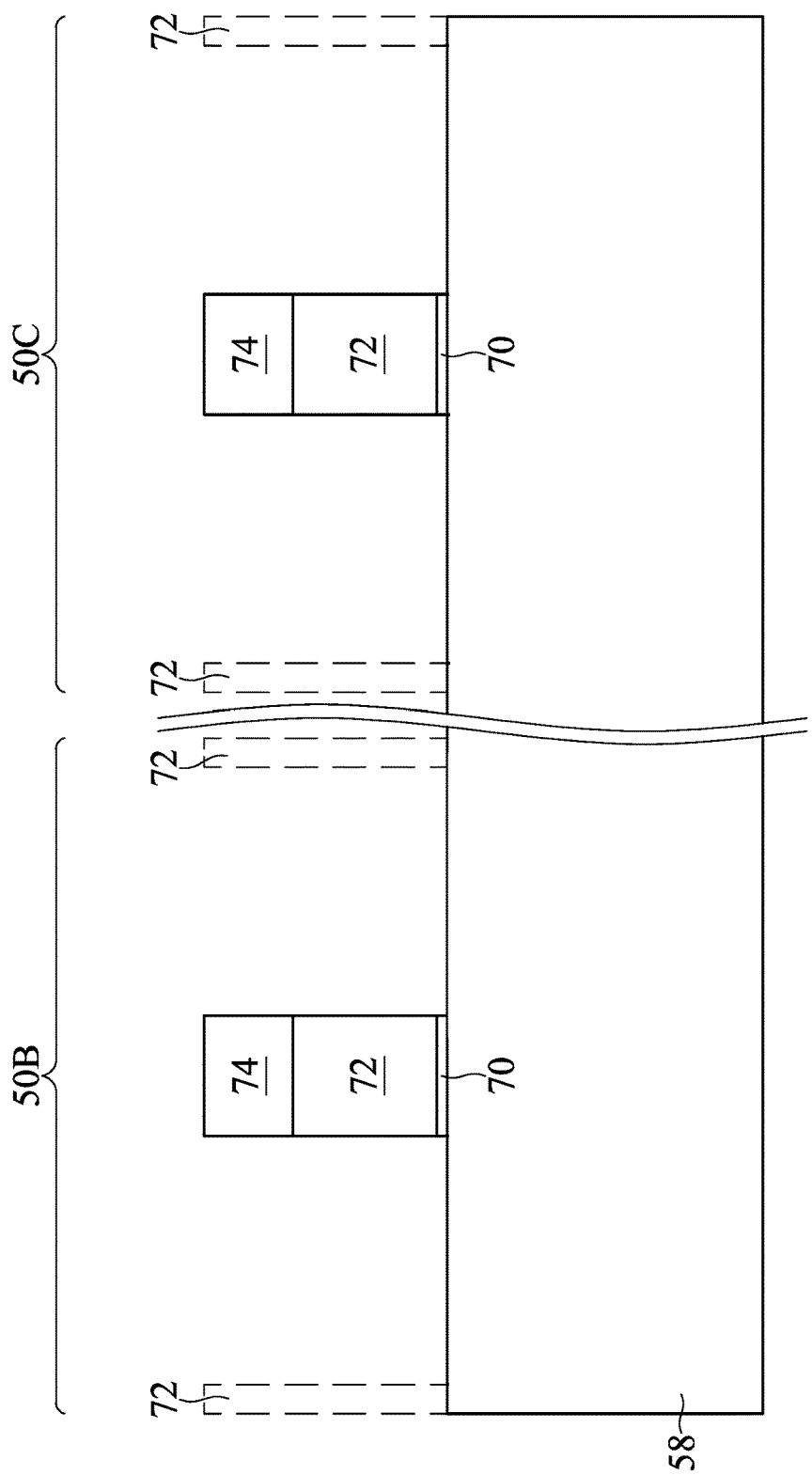

In FIG. 7, the mask layer 64 is patterned using acceptable photolithography and etching techniques to form masks 74. The pattern of the masks 74 then may be transferred to the dummy gate layer 62 and the dummy dielectric layer 60 by an acceptable etching technique to, respectively, form dummy gates 72 and dummy gate dielectric layers 70. The dummy gates 72 and dummy gate dielectric layers 70 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins.

Figure 8:
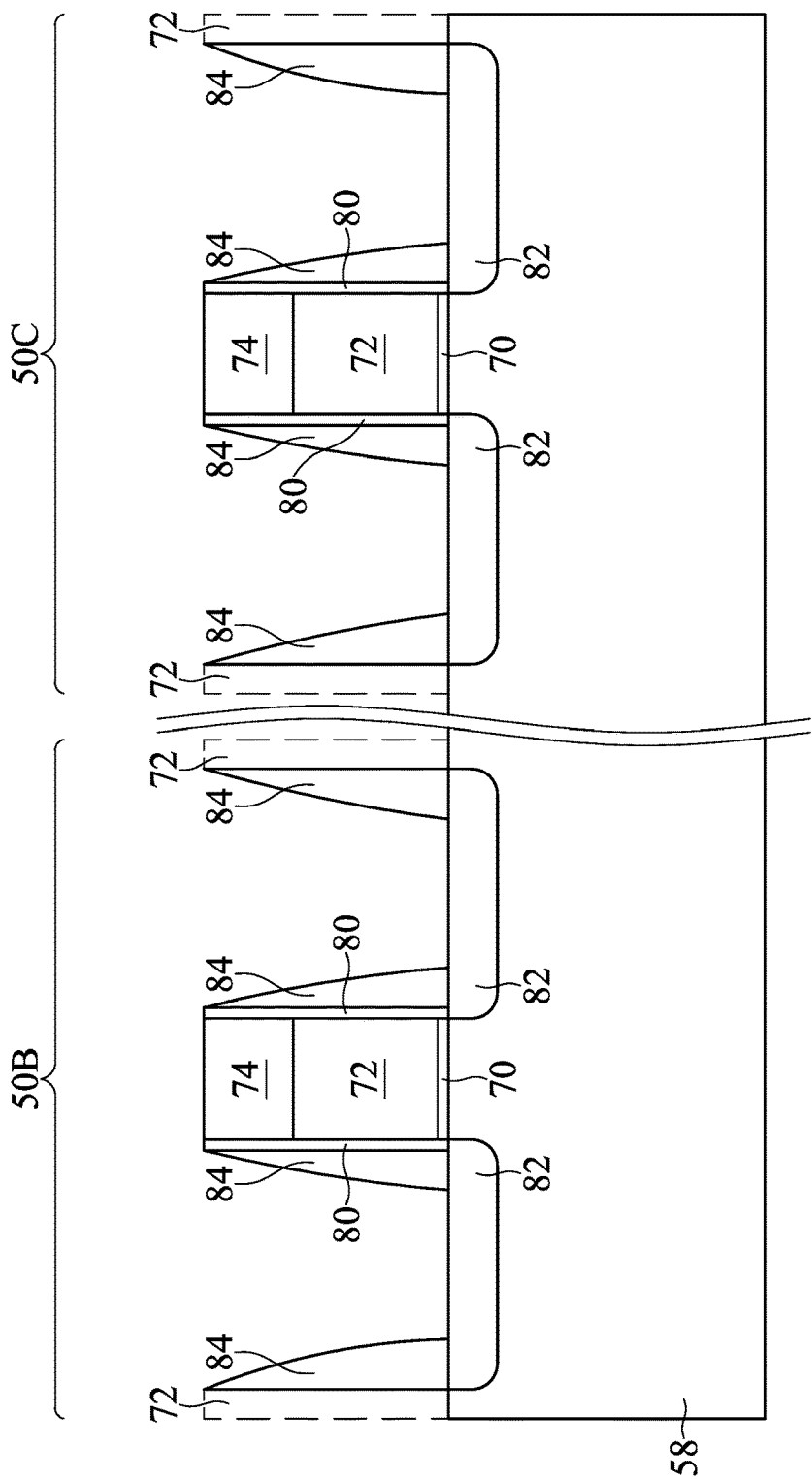

In FIG. 8, gate seal spacers 80 can be formed on exposed surfaces of the dummy gates 72 and/or the fins 58. A thermal oxidation or a deposition followed by an anisotropic etch may form the gate seal spacers 80. In some embodiments, the gate seal spacer may be formed of a nitride, such as silicon nitride, silicon oxynitride, silicon carbide, silicon carbonitride, the like, or a combination thereof. The gate seal spacers 80 seal the sidewalls of subsequently formed gate stacks, and may act as additional gate spacing layers.

Further, implants for lightly doped source/drain (LDD) regions 82 may be performed. In the embodiments with different device types, similar to the implants discussed above in FIG. 5, a mask, such as a photoresist, may be formed over the region 50B, while exposing the region 50C, and appropriate type (e.g., n-type or p-type) impurities may be implanted into the exposed fins 58 in the region 50C. The mask may then be removed. Subsequently, a mask, such as a photoresist, may be formed over the region 50C while exposing the region 50B, and appropriate type impurities may be implanted into the exposed fins 58 in the region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further, gate spacers 84 are formed on the gate seal spacers 80 along sidewalls of the dummy gates 72 and over the LDD regions 82. The gate spacers 84 may be formed by conformally depositing a material and subsequently anisotropically etching the material. The material of the gate spacers 84 may be silicon nitride, SiCN, a combination thereof, or the like. The etch may be selective to the material of the gate spacers 84, such that the LDD regions 82 are not etched during the formation of the gate spacers 84.

In FIGS. 9A, 9B, 10, 11, 12A, 12B, and 12C, epitaxial source/drain regions 86 are formed in the fins 58 in the first region 50B. The epitaxial source/drain regions 86 are formed in the fins 58 such that each dummy gate 72 is disposed between respective neighboring pairs of the epitaxial source/drain regions 86. In some embodiments, the epitaxial source/drain regions 86 may extend through the LDD regions 82. In some embodiments, the gate seal spacers 80 and gate spacers 84 are used to separate the epitaxial source/drain regions 86 from the dummy gates 72 by an appropriate lateral distance so that the epitaxial source/drain regions 86 do not short out subsequently formed gates of the resulting FinFETs.

Figure 9:
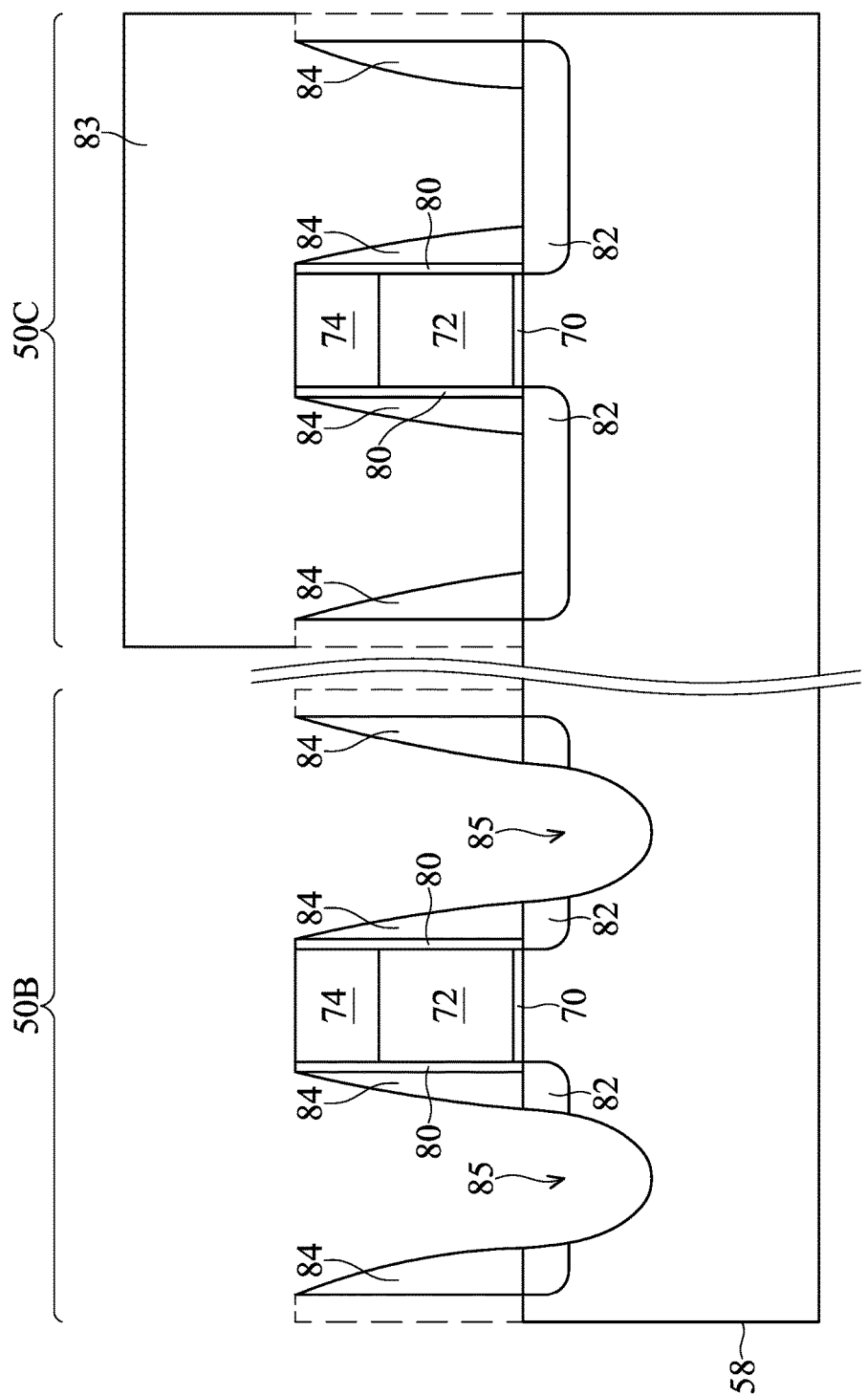

During the formation of the epitaxial source/drain regions 86 in region 50B, e.g., the NMOS region, the region 50C, e.g., the PMOS region may be masked by a mask 83. Referring first to FIG. 9, a patterning process is performed on the fins 58 to form recesses 85 in source/drain regions of the fins 58. The patterning process may be performed in a manner that the recesses 85 are formed between neighboring dummy gate stacks 72 (in interior regions of the fins 58), or between an isolation region 56 and adjacent dummy gate stacks 72 (in end regions of the fins 58). In some embodiments, the patterning process may include a suitable anisotropic dry etching process, while using the dummy gate stacks 72, the gate spacers 84, and/or isolation regions 56 as a combined mask. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, a combination thereof, or the like. In some embodiments, the patterning process forms recesses 85 having U-shaped bottom surfaces. The recesses 85 may also be referred to as U-shaped recesses 85, an example recess 85 of which is shown in FIG. 9.

Figure 10:
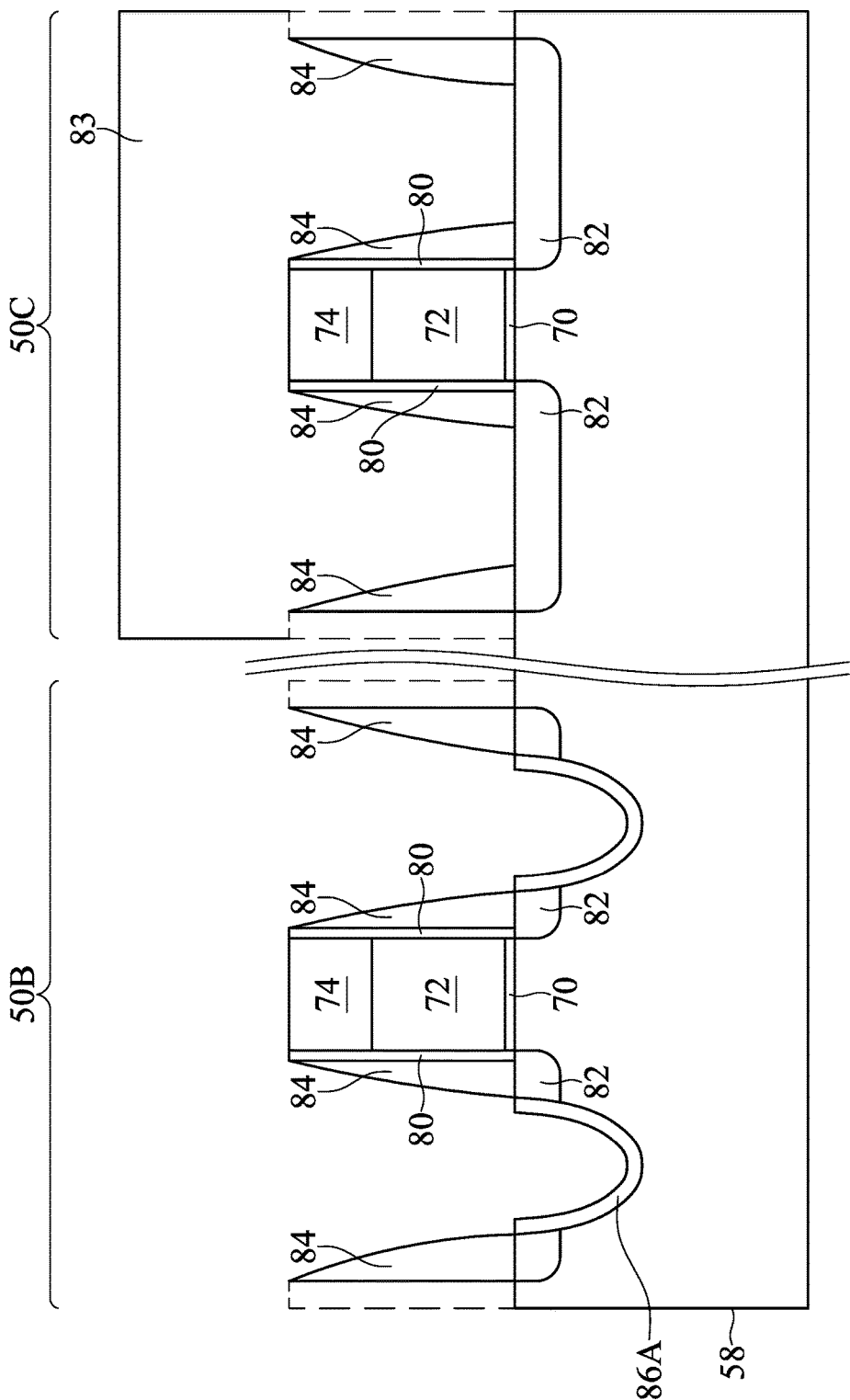
Figure 11:
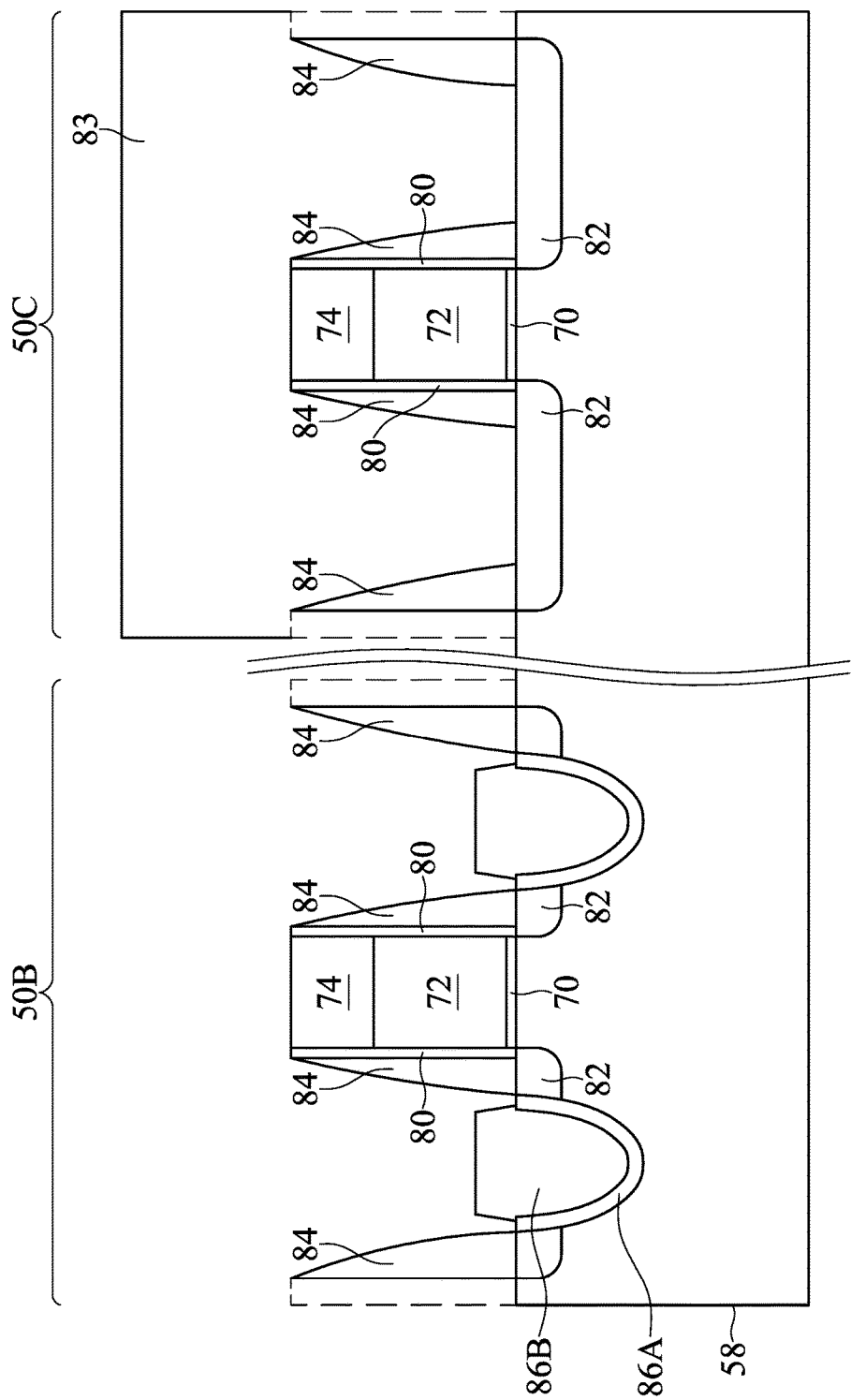
Figure 12A:
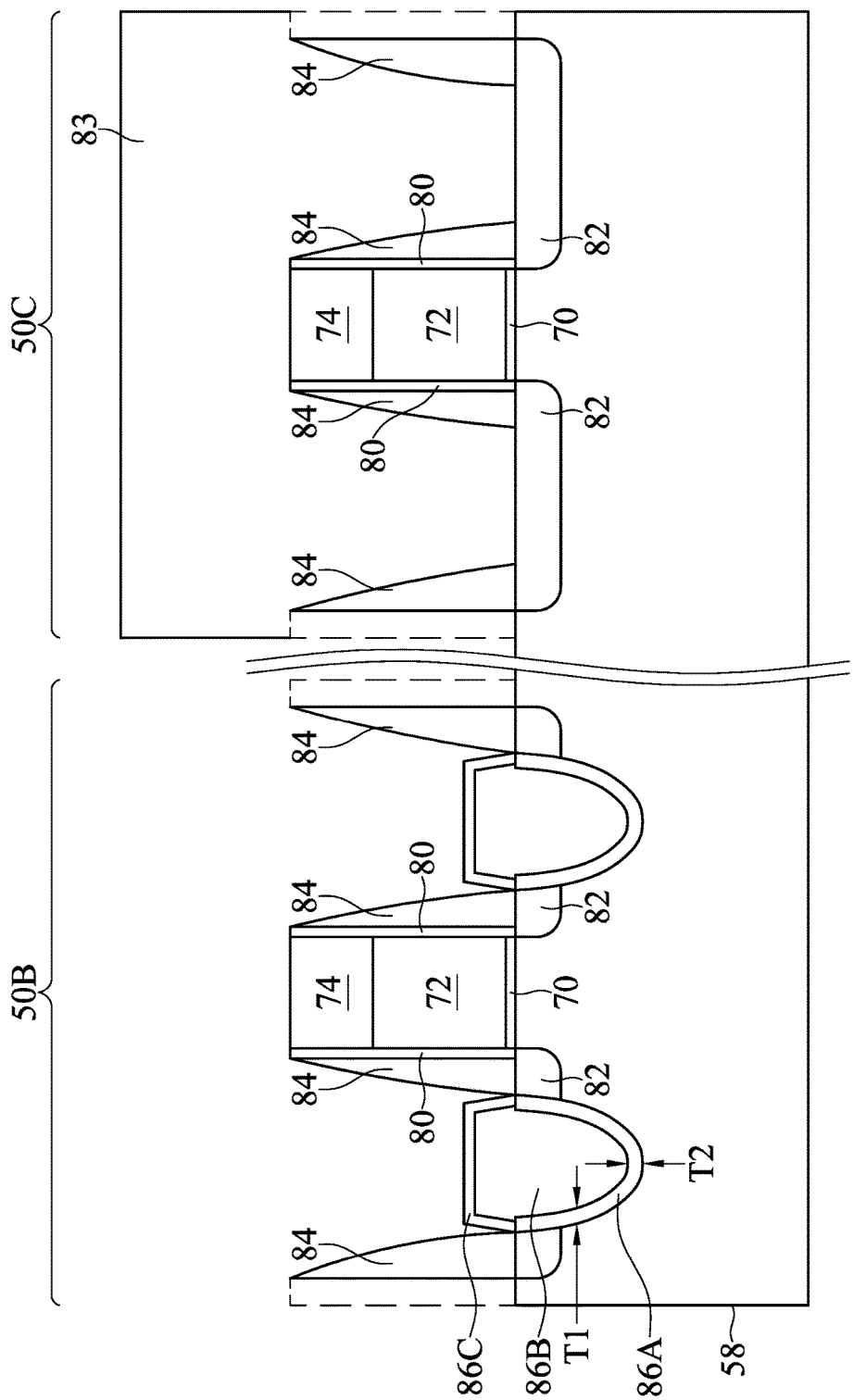
Figure 12C:
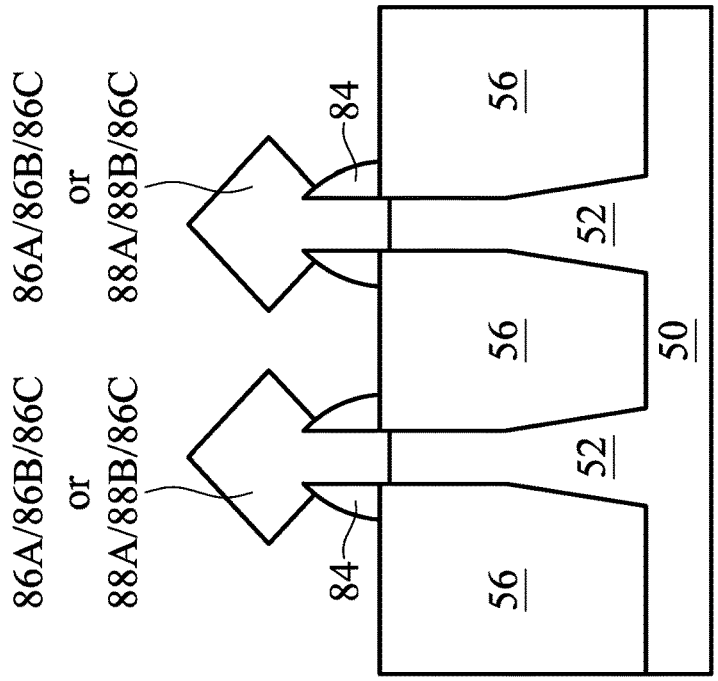
Figure 12B:
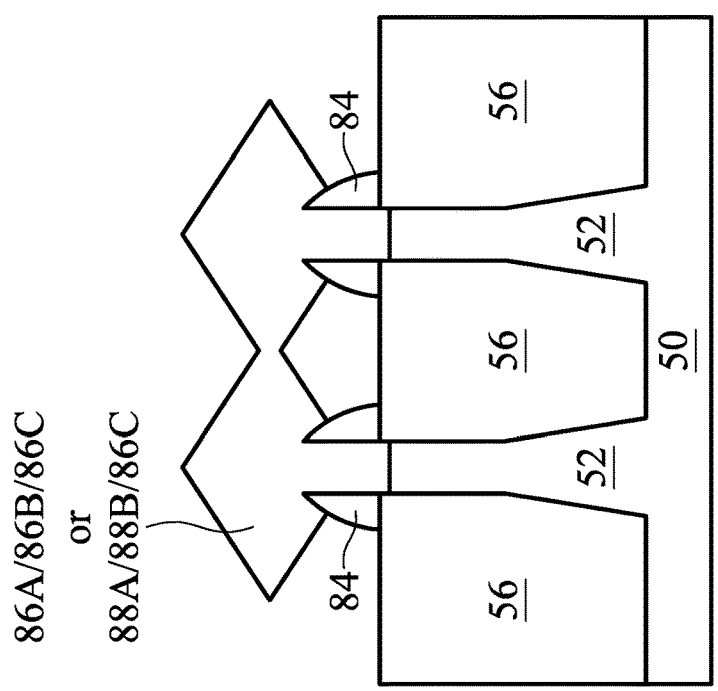

In FIGS. 10, 11, and 12A, the epitaxial source/drain regions 86 in the region 50B are epitaxially grown in the recesses. In FIG. 10, a first layer 86A of the epitaxial source/drain regions 86 are formed in the region 50B. The first layer 86A may include SiC, SiCP, the like, or a combination thereof. The first layer 86A may be epitaxially grown to line the recesses 85. The epitaxial process may be begun by introducing a silicon precursor such as silane ($SiH_4$), dichlorosilane (DCS) ($SiH_4Cl_2$), or a combination thereof, and a carbon precursor such as methylsilane ($CSiH_6$) to the fin 58 in the recess 85. In an embodiment the silicon precursor is introduced at a flow rate of from about 400 sccm to about 1200 sccm, such as about 850 sccm, while the carbon precursor is introduced at a flow rate from about 40 sccm to about 100 sccm, such as about 70 sccm. Further, the deposition may be performed at a temperature of from about 630° C. to about 710° C., such as about 700° C., and a pressure of between about 100 Torr and about 300 Torr, such as about 200 Torr. The first layer 86A may be formed to have an atomic concentration of carbon in a range from about 0.2% to about 5%, such as about 3%. An atomic concentration of carbon that is higher than 5% can increase the resistance of the source/drain regions in a way that can negatively impact the performance of the device. This first layer 86A (e.g., SiC and/or SiCP) in the region 50B has a low etch rate to the etchants used during the removal of the dummy gate 72 and can help to protect the source/drain region 86 from being attacked and damaged during the dummy gate removal process.

In FIG. 11, a second layer 86B of the epitaxial source/drain regions 86 are formed in the region 50B. The second layer 86B may include SiP, SiCP, the like, or a combination thereof. The second layer 86B may be epitaxially grown on the first layer 86A to fill the remaining portions of the recesses 85. The second layer 86B of the epitaxial source/drain regions 86 in the region 50B may have surfaces raised from respective surfaces of the fins 58 and may have facets. The second layer 86B may have an impurity concentration of phosphorous between about $10^{19}$ cm$^{-3}$ and about $10^{21}$ cm$^{-3}$.

In FIG. 12A, a cap layer 86C of the epitaxial source/drain regions 86 are formed in the region 50B. The cap layer 86C may include SiP or the like. The cap layer 86C may be epitaxially grown on the second layer 86B and may cover the second layer 86B and any exposed portions of the first layer 86A. The cap layer 86C may have a substantially uniform thickness over the facets of the second layer 86B. In some embodiments, the cap layer 86B has an impurity concentration of phosphorous lower than the impurity concentration of phosphorous in the second layer 86B. In some embodiments, the cap layer 86B has an impurity concentration of phosphorous higher than the impurity concentration of phosphorous in the second layer 86B.

As illustrated in the FIG. 12A, the first layer 86A has a thickness T1 at the sidewalls of the recesses 85 and a thickness T2 at the bottom of the recesses 85. In some embodiments, the thickness T1 is in a range from about 1 nm to about 6 nm, and the thickness T2 is in a range from about 4 nm to about 12 nm. In some embodiments, the ratio of the thicknesses T1/T2 is in a range from about 0.15 to about 0.4. The thickness T1 being between 1 nm and 6 nm at the sidewalls is of sufficient thickness to provide protection from the wet etch during the removal of the dummy gate while also not being too thick to significantly reduce the volume of the second layer 86B as the second layer 86B can be used as a stressor to strain the channel region of the device.

As a result of the epitaxy processes used to form the epitaxial source/drain regions 86 in the region 50B and the region 50C, upper surfaces of the epitaxial source/drain regions 86 have facets which expand laterally outward beyond a sidewalls of the fins 58. In some embodiments, these facets cause adjacent epitaxial source/drain regions 86 of a same FinFET to merge, as illustrated by the embodiment of FIG. 12B. In other embodiments, adjacent epitaxial source/drain regions 86 remain separated after the epitaxy process is completed, as illustrated by the embodiment of FIG. 12C.

In FIGS. 13, 14, 15, and 16 epitaxial source/drain regions 88 are formed in the fins 58 in the second region 50C. The epitaxial source/drain regions 88 are formed in the fins 58 such that each dummy gate 72 is disposed between respective neighboring pairs of the epitaxial source/drain regions 88. In some embodiments, the epitaxial source/drain regions 88 may extend through the LDD regions 82. In some embodiments, the gate seal spacers 80 and gate spacers 84 are used to separate the epitaxial source/drain regions 88 from the dummy gates 72 by an appropriate lateral distance so that the epitaxial source/drain regions 88 do not short out subsequently formed gates of the resulting FinFETs.

Figure 13:
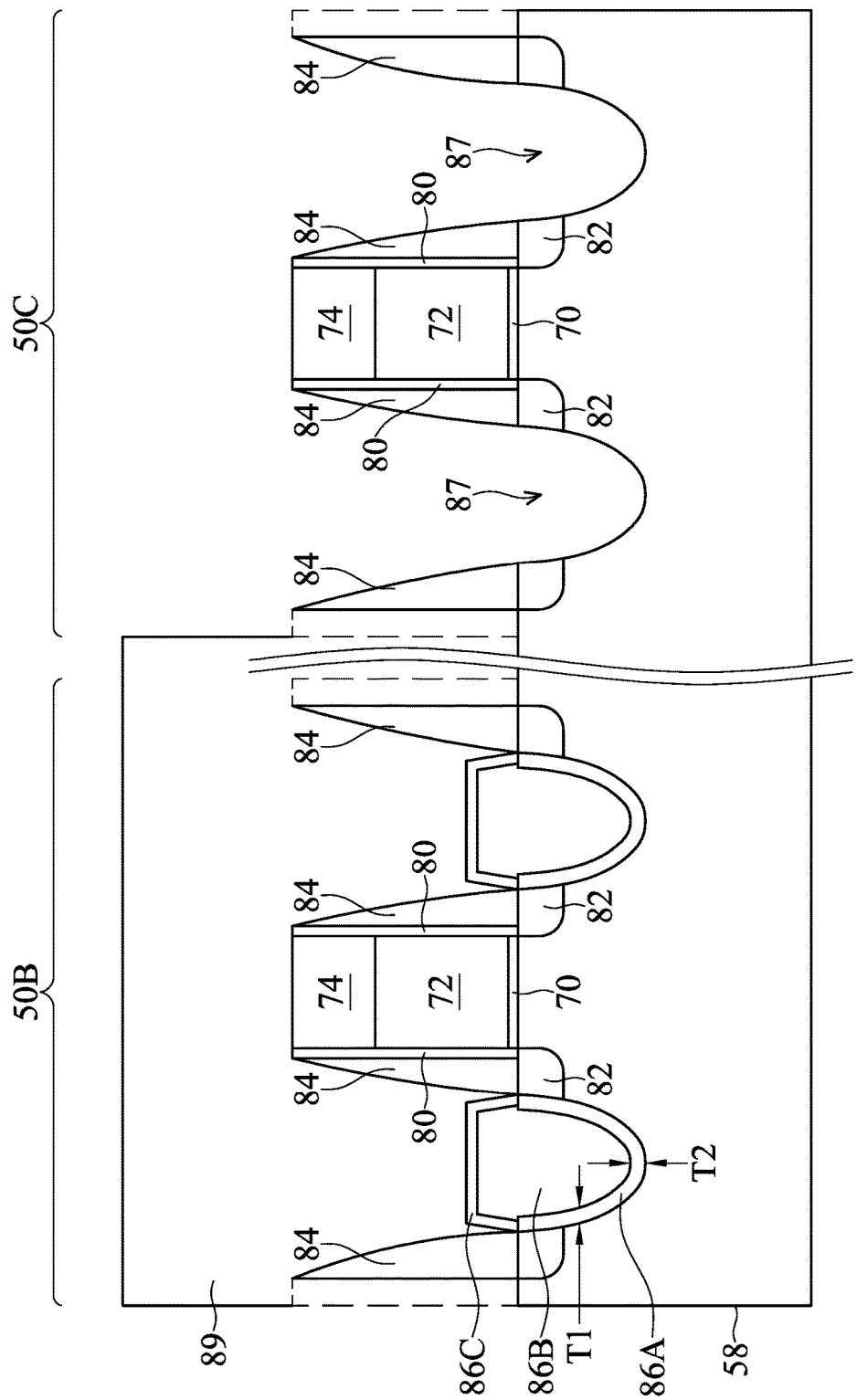

During the formation of the epitaxial source/drain regions 88 in region 50C, e.g., the PMOS region, the region 50B, e.g., the NMOS region may be masked by a mask 89. Referring first to FIG. 13, a patterning process is performed on the fins 58 to form recesses 87 in source/drain regions of the fins 58. The formation of the recesses 87 may be similar to the formation of the recesses 85 described above and the description is not repeated herein. Although in some embodiments, the recesses 85 and 87 are formed by different processes. The recesses 87 may also be referred to as U-shaped recesses 87, an example recess 87 of which is shown in FIG. 13.

Figure 14:
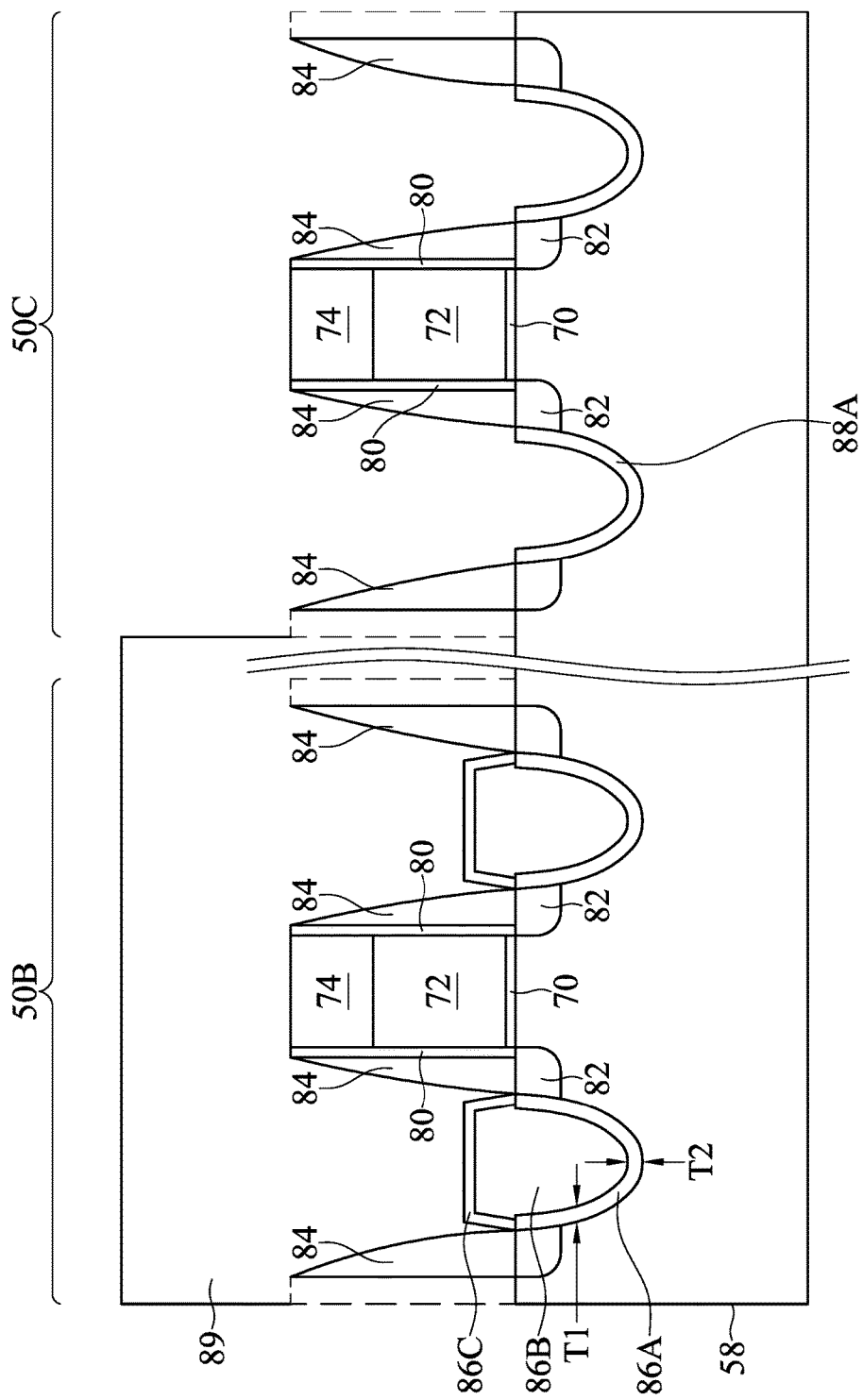
Figure 15:
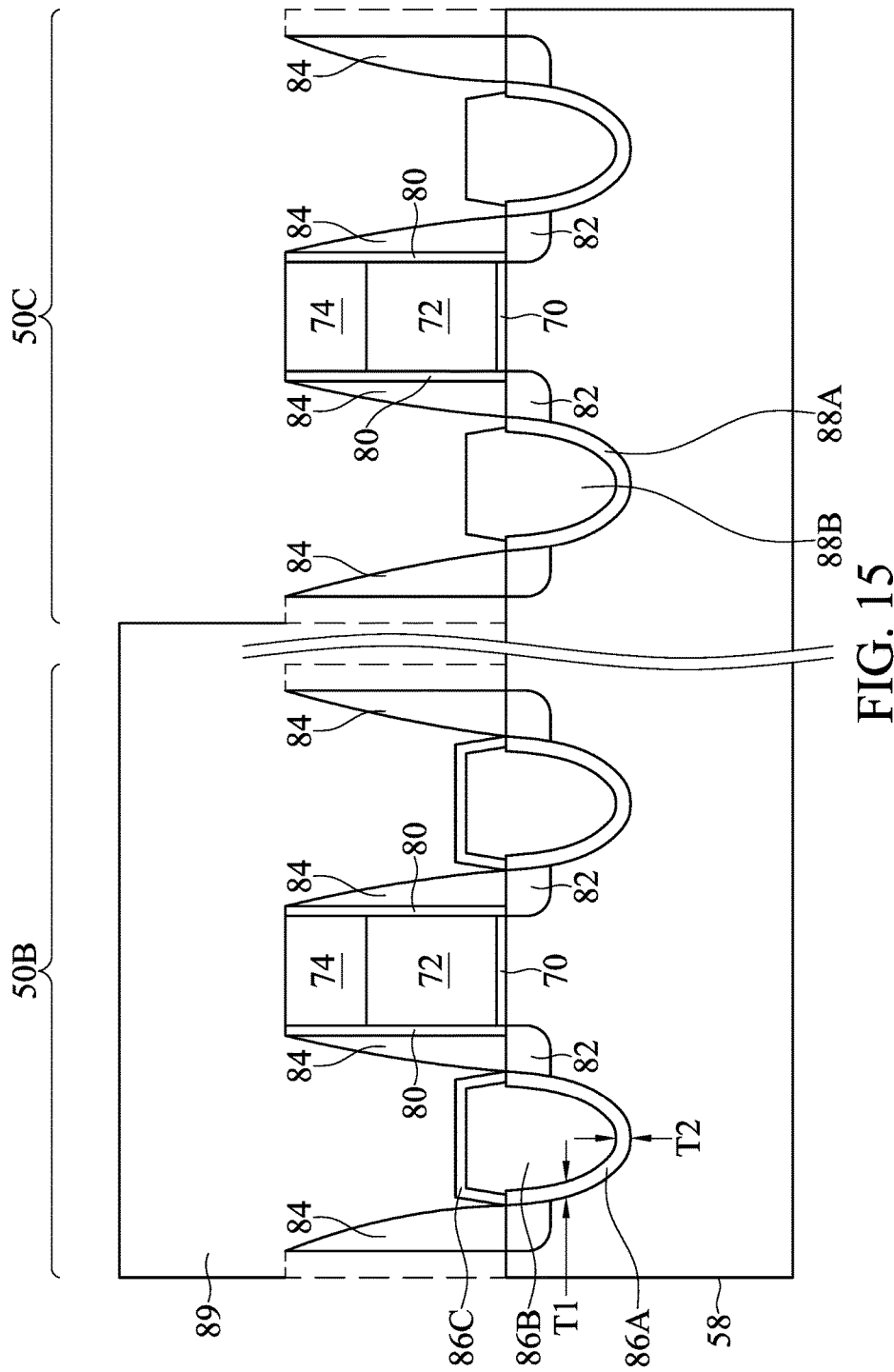
Figure 16:
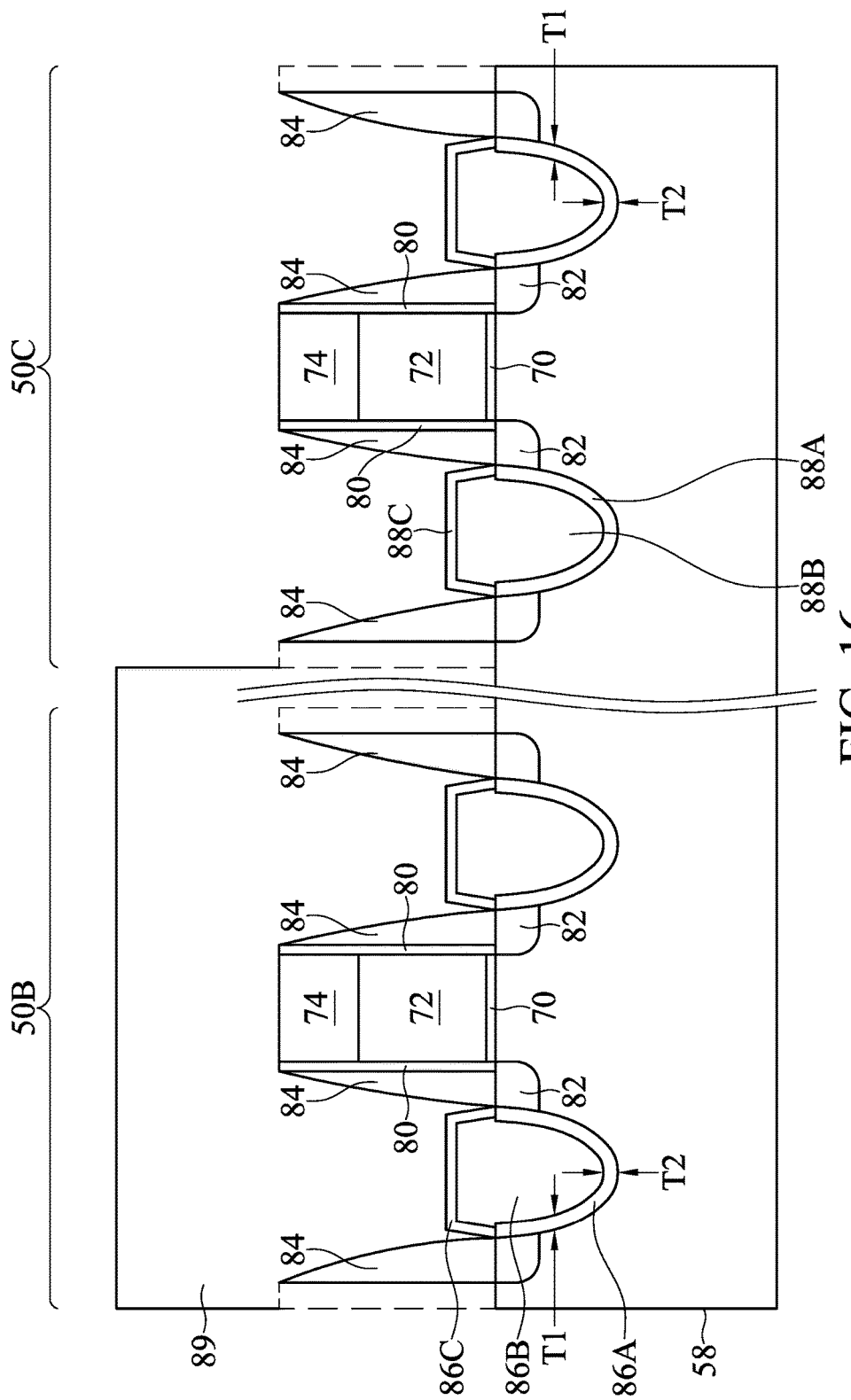

In FIGS. 14, 15, and 16, the epitaxial source/drain regions 88 in the region 50C are epitaxially grown in the recesses. In FIG. 14, a first layer 88A of the epitaxial source/drain regions 88 are formed in the region 50C. The first layer 88A may include SiC, SiGeC, SiGeBC, the like, or a combination thereof. The first layer 88A may be epitaxially grown to line the recesses 87. In an embodiment, the first layer 88A may be epitaxially grown to line the recesses 87. The epitaxial process may be begun by introducing a silicon precursor such as silane ($SiH_4$), dichlorosilane (DCS) ($SiH_4Cl_2$), or a combination thereof, and a carbon precursor such as methylsilane ($CSiH_6$) to the fin 58 in the recess 87. In an embodiment the silicon precursor is introduced at a flow rate of from about 400 sccm to about 1200 sccm, such as about 850 sccm, while the carbon precursor is introduced at a flow rate from about 40 sccm to about 100 sccm, such as about 70 sccm. Further, the deposition may be performed at a temperature of from about 630° C. to about 710° C., such as about 700° C., and a pressure of between about 100 Torr and about 300 Torr, such as about 200 Torr. The first layer 88A may be formed to have an atomic concentration of carbon in a range from about 0.2% to about 5%, such as about 3%. An atomic concentration of carbon that is higher than 5% can increase the resistance of the source/drain regions in a way that can negatively impact the performance of the device. This first layer 88A (e.g., SiC, SiGeC, or SiGeBC) in the region 50C has a low etch rate to the etchants used during the removal of the dummy gate 72 and can help to protect the source/drain region 88 from being attacked and damaged during the dummy gate removal process.

In FIG. 15, a second layer 88B of the epitaxial source/drain regions 86 are formed in the region 50C. The second layer 88B may include SiGe, SiGeB, the like, or a combination thereof. The second layer 88B may be epitaxially grown on the first layer 88A to fill the remaining portions of the recesses 87. The second layer 88B of the epitaxial source/drain regions 88 in the region 50C may have surfaces raised from respective surfaces of the fins 58 and may have facets. The second layer 88B may have an impurity concentration of boron and/or germanium between about $10^{19}$ $cm^{-3}$ and about $10^{21}$ $cm^{-3}$.

In FIG. 16, a cap layer 88C of the epitaxial source/drain regions 88 are formed in the region 50C. The cap layer 88C may include Si, SiGe, SiGeB, or the like. The cap layer 88C may be epitaxially grown on the second layer 88B and may cover the second layer 88B and any exposed portions of the first layer 88A. The cap layer 88C may have a substantially uniform thickness over the facets of the second layer 88B. In some embodiments, the cap layer 88C has an impurity concentration of boron and/or germanium lower than the impurity concentration of boron and/or germanium in the second layer 88B. In some embodiments, the cap layer 88C has an impurity concentration of boron and/or germanium higher than the impurity concentration of boron and/or germanium in the second layer 88B.

As illustrated in the FIG. 16, the first layer 88A has the thickness T1 at the sidewalls of the recesses 87 and the thickness T2 at the bottom of the recesses 87. In some embodiments, the thickness T1 is in a range from about 1 nm to about 6 nm, and the thickness T2 is in a range from about 4 nm to about 12 nm. In some embodiments, the ratio of the thicknesses T1/T2 is in a range from about 0.15 to about 0.4. The thickness T1 being between 1 nm and 6 nm at the sidewalls is of sufficient thickness to provide protection from the wet etch during the removal of the dummy gate while also not being too thick to significantly reduce the volume of the second layer 88B as the second layer 88B can be used as a stressor to strain the channel region of the device.

As a result of the epitaxy processes used to form the epitaxial source/drain regions 88 in the region 50C, upper surfaces of the epitaxial source/drain regions 88 have facets which expand laterally outward beyond a sidewalls of the fins 58. In some embodiments, these facets cause adjacent epitaxial source/drain regions 88 of a same FinFET to merge, as illustrated by the embodiment of FIG. 12B. In other embodiments, adjacent epitaxial source/drain regions 88 remain separated after the epitaxy process is completed, as illustrated by the embodiment of FIG. 12C.

Figure 17:
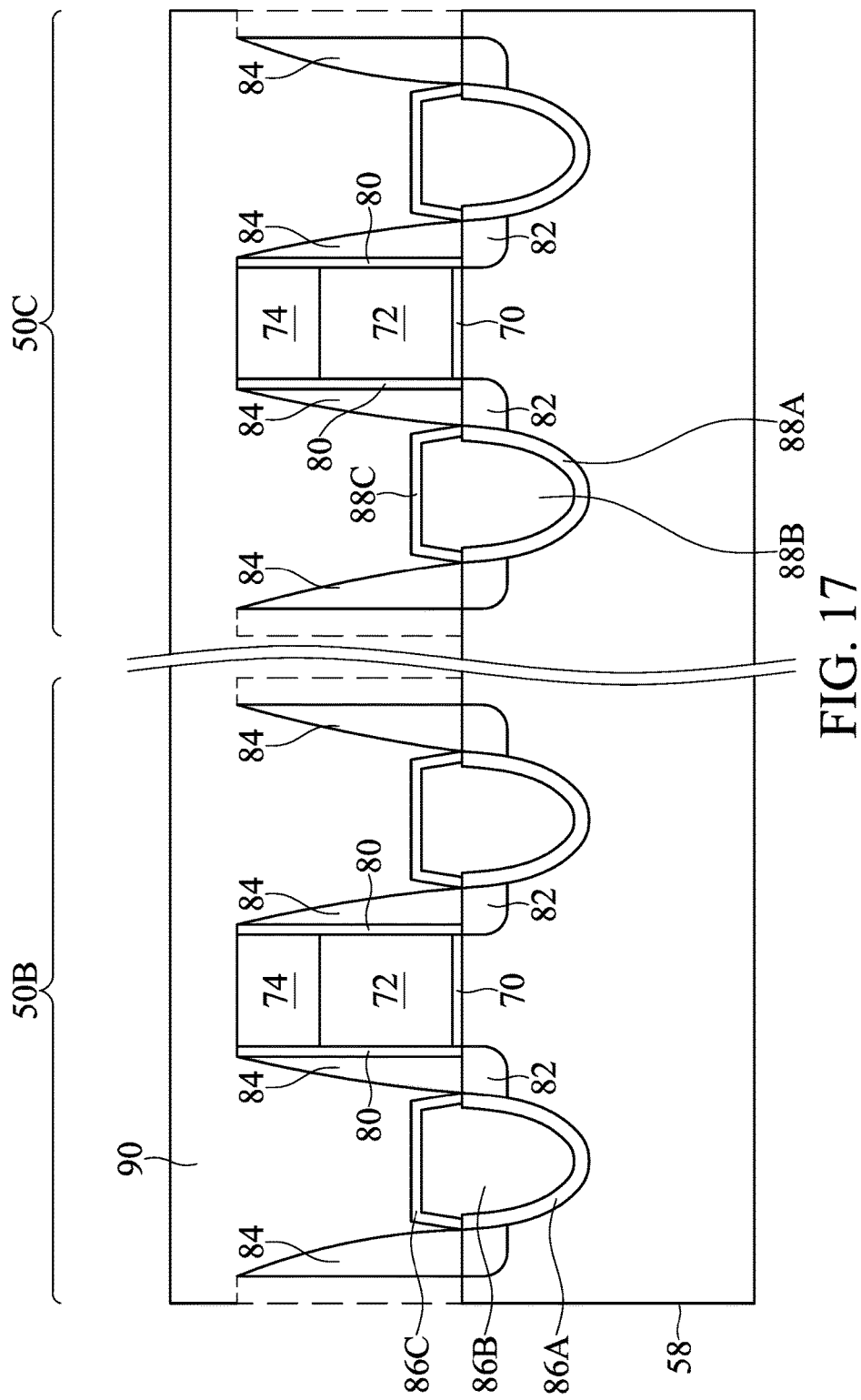

In FIG. 17, an ILD 90 is deposited over the fins 58. The ILD 90 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL), not illustrated, is disposed between the ILD 90 and the epitaxial source/drain regions 86, the gate spacers 84, the gate seal spacers 80, and the masks 74.

Figure 18:
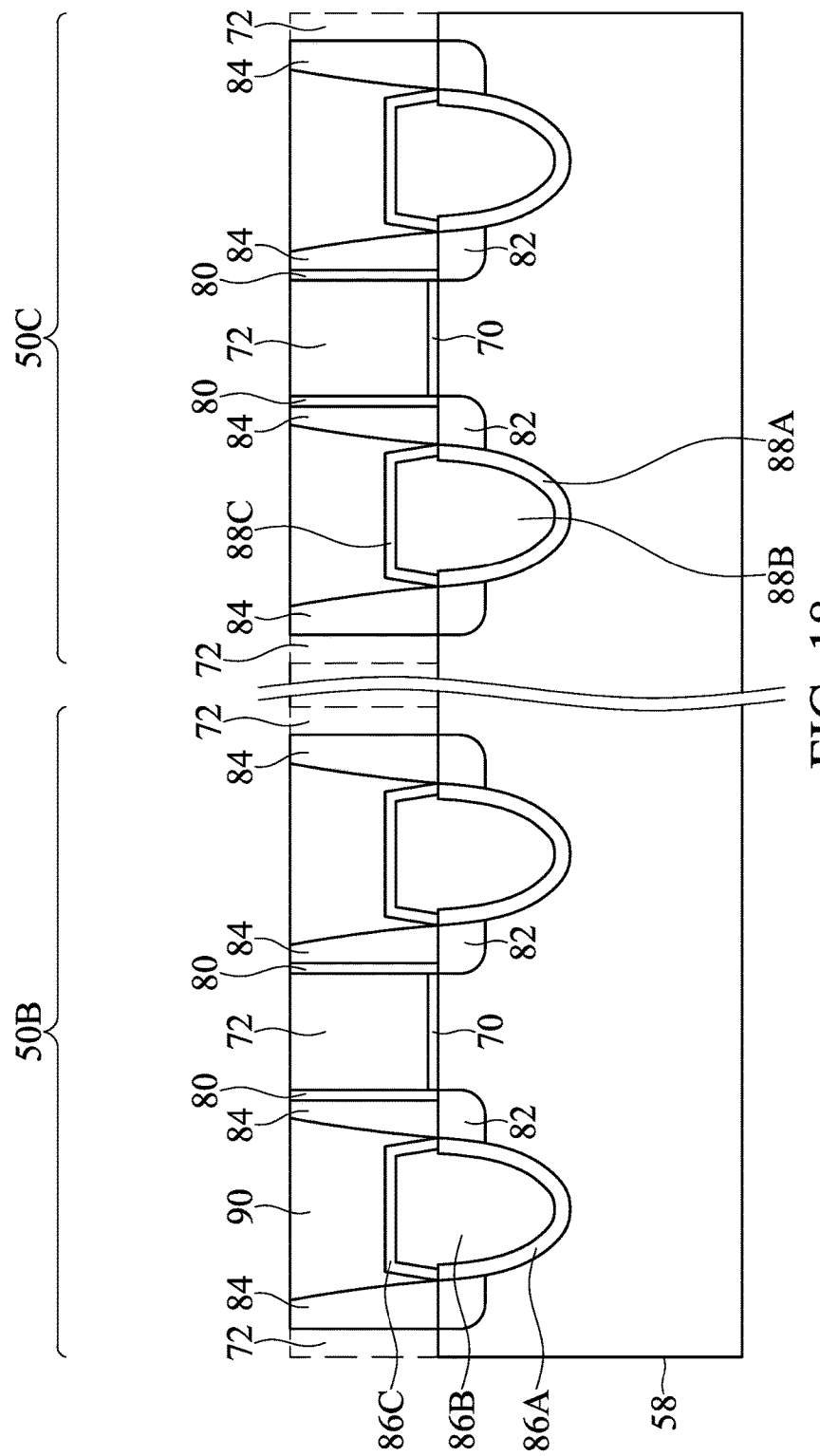

In FIG. 18, a planarization process, such as a CMP, may be performed to level the top surface of the ILD 90 with the top surfaces of the dummy gates 72. The planarization process may also remove the masks 74 on the dummy gates 72, and portions of the gate seal spacers 80 and the gate spacers 84 along sidewalls of the masks 74. After the planarization process, top surfaces of the dummy gates 72, the gate seal spacers 80, the gate spacers 84, and the ILD 90 are level. Accordingly, the top surfaces of the dummy gates 72 are exposed through the ILD 90.

Figure 19:
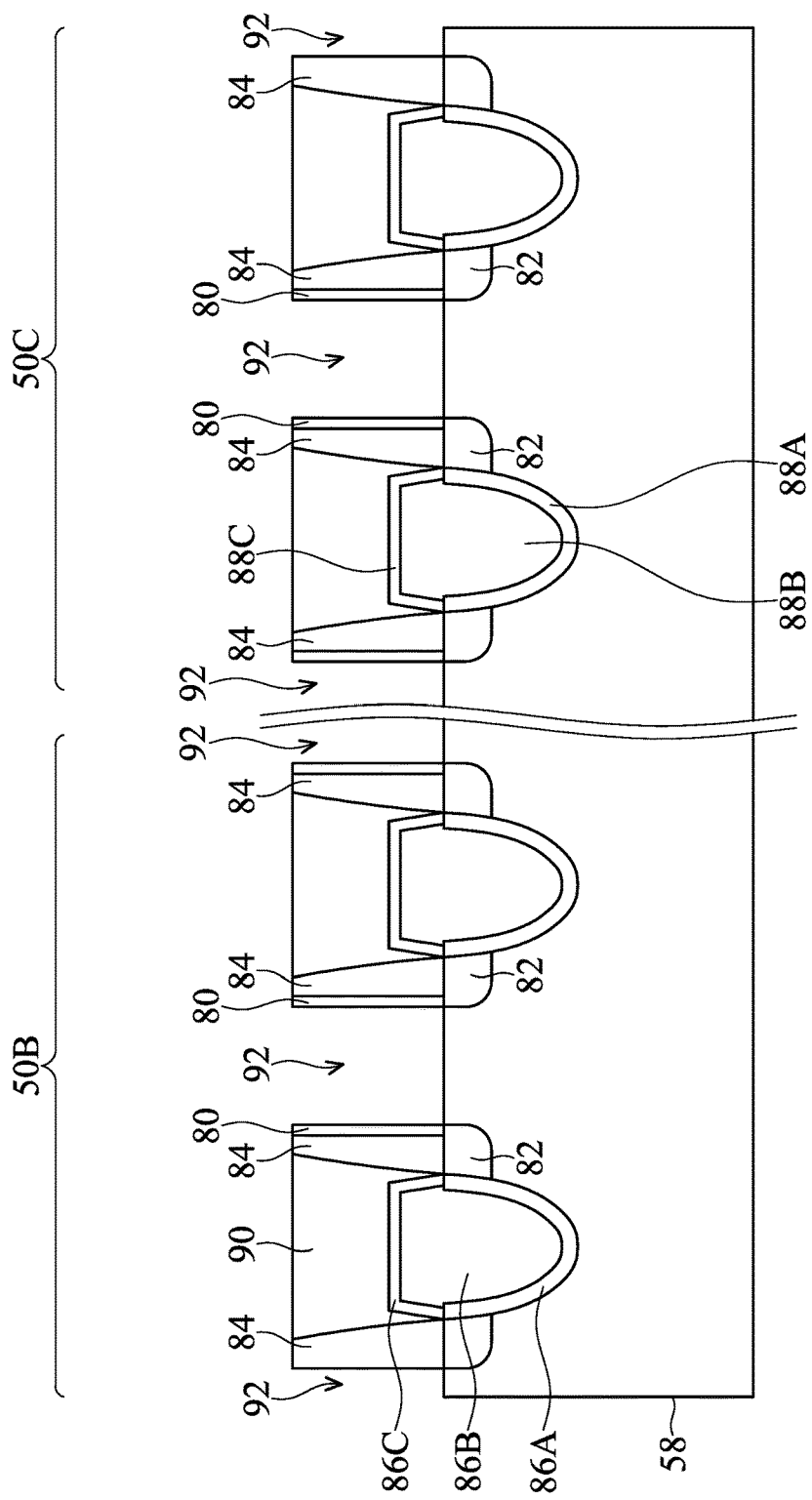

In FIG. 19, the dummy gates 72 and portions of the dummy gate dielectric layers 70 directly underlying the exposed dummy gates 72 are removed in an etching step(s), so that recesses 92 are formed. In some embodiments, the dummy gates 72 are removed in a wet etching process. For example, wet etch process can utilize a wet etching chemical, such as $NH_4OH$, that using reactants (etchants) that selectively etch the dummy gates 72 without significantly the ILD 90 or the gate spacers 84. Each recess 92 exposes a channel region of a respective fin 58. Each channel region is disposed between neighboring pairs of the epitaxial source/drain regions 86. During the removal, the dummy gate dielectric layers 70 may be used as an etch stop layer when the dummy gates 72 are etched. The dummy gate dielectric layers 70 may then be removed after the removal of the dummy gates 72.

If there were a defect or break in the gate seal spacer 80 and/or gate spacer 84, the first layer 86A, which has a low etch rate to the etchants used, would protect the second layer 86B from being attacked and damaging the source/drain region 86 during the dummy gate removal process. If the source/drain region 86 were to be damaged during the dummy gate removal process, the subsequent formation of the replacement gate could allow metal of the replacement gate to extrude through the defect and into the damaged area of the source/drain region. This extruded gate portion could short the gate to the source/drain region and render the device non-functional.

By having the first layers 86A and 88A of the source/drain 86 and 88 have an atomic concentration of carbon in a range from about 0.2% to about 5%, the occurrence of metal gate extrusion is reduced. For example, by having the atomic concentration of carbon at least about 0.2%, the metal extrusion defect rate is significantly improved. Moreover, when the atomic concentration of carbon is at least 2%, the metal extrusion defect rate is effectively zero and with an atomic concentration of carbon between about 2.5% and about 5%, the metal extrusion defect rate is zero. The defect rate is reduced in part due to the reduced etch rate of the first layer that includes carbon. For example, when the atomic concentration of carbon in the first layer is increased from about 1% to about 2.5%, the etch rate of the first layer is decreased by about 80%.

In some embodiments, the dummy gates 72 are removed by an anisotropic dry etch process. For example, the etching process may include a dry etch process using reaction gas(es) that selectively etch the dummy gates 72 without significantly etching the ILD 90 or the gate spacers 84. In some embodiments, the dummy gates 72 may be removed by utilizing both a wet etch process and a dry etch process.

Figure 20:
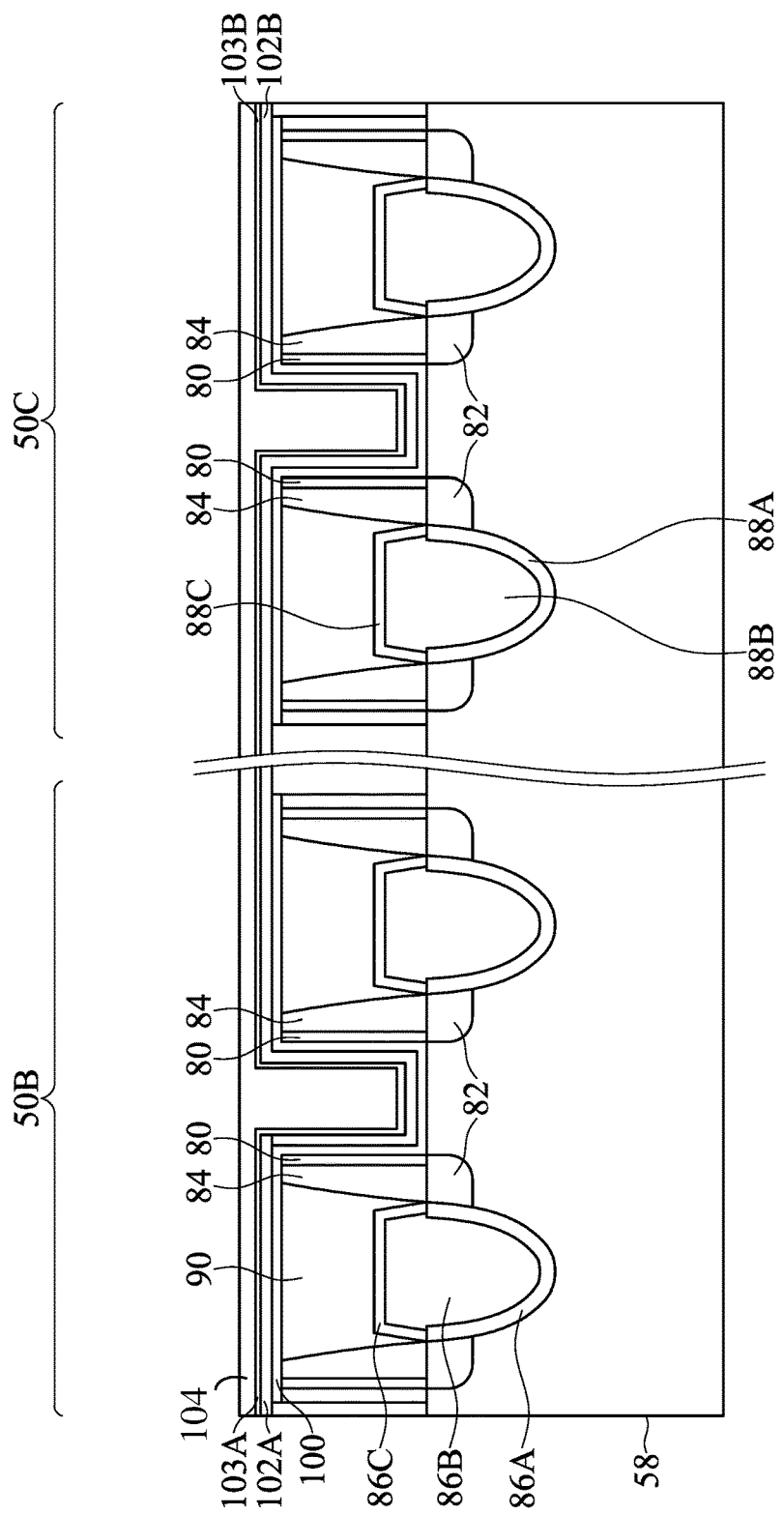

In FIG. 20, an interface layer 100 is formed in the recesses 92. The interface layer 100 is conformally formed over the fin 58, and thus the interface layer 100 lines sidewalls and the bottom surface of the recesses 92. The interface layer 100 may also cover the upper surface of the ILD 90. In accordance with some embodiments, the interface layer 100 is an oxide of the material of the fin 58, and may be formed by, e.g., oxidizing the fins 58 in the recesses 92. The interface layer 100 may also be formed by a deposition process, such as a chemical vapor deposition (CVD) process, a physical vapor deposition (PVD) process, an atomic layer deposition (ALD) process, or the like.

Further, a gate dielectric layer 102 (including gate dielectric layer 102a in region 50B and gate dielectric layer 102b in region 50C) is formed over the interface layer 100. The gate dielectric layer 102 may be deposited conformally in the recesses 92, such as on the top surfaces and the sidewalls of the fins 58 and on sidewalls of the interface layer 100 in the recesses 92. The gate dielectric layer 102 may also be formed along top surfaces of the ILD 90. In accordance with some embodiments, the gate dielectric layer 102 is a high-k dielectric material having a k value greater than about 7.0, and may include a metal oxide or a silicate of Hf, Al, Zr, La, Mg, Ba, Ti, Pb, and combinations thereof. The formation methods of the gate dielectric layer 102 may include Molecular-Beam Deposition (MBD), ALD, PECVD, and the like. The layer 102a and 102b may have different material compositions or may have the same material composition.

Further in FIG. 20, conductive material is formed to fill the recesses 92. The conductive material may include one or more barrier layers, work function layers, and/or work function tuning layers to tune the work function of the subsequently formed gate electrodes. In an embodiment, a work function layer 103 (including work function layer 103a in region 50B and work function layer 103b in region 50C) is deposited over the gate dielectric layer 102. The work function layer 103 may be a metal-containing material such as Al, TiC, TiN, combinations thereof, or multi-layers thereof. The gate electrode layer 104 is then deposited over the work function layer 103 and fills the recesses 92. The gate electrode layer 104 may be a metal-containing material such as W, TiN, TaN, TaC, TiO, Co, Ru, Al, combinations thereof, or multi-layers thereof. Although a single gate electrode layer 104 and a single work function layer 103 is shown, any number of gate electrode layers 104 and any number of work function layers 103 may be deposited in the recesses 92.

Figure 21:
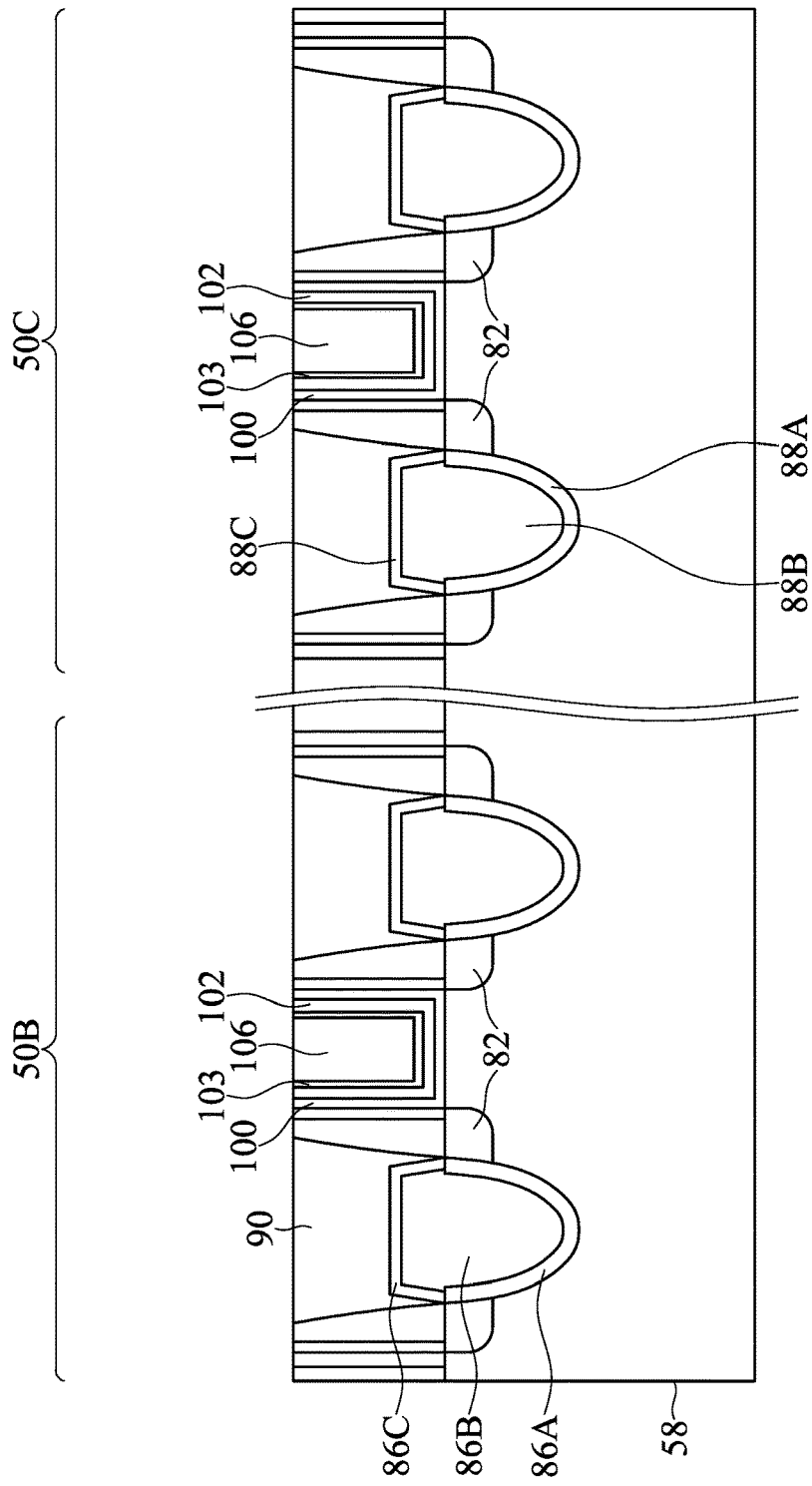

In FIG. 21, a planarization process, such as a CMP, is performed to remove the excess portions of the interface layer 100, gate dielectric layer 102, work function layer 103, and gate electrode layer 104, which excess portions are over the top surface of the ILD 90. The remaining portions of the gate electrode layer 104 and work function layer 103 form gate electrodes 106, which in combination with the other layers, form replacement gates of the resulting FinFETs. The interface layer 100, gate dielectric layer 102, work function layer 103, and gate electrode layers 104 may be collectively referred to as the "gates" or "gate stacks" of the resulting FinFETs. The gate stacks may extend along sidewalls of the channel region of the fins 58.

The formation of the gates in regions 50B and 50C may occur simultaneously such that the gates in these regions are made of the same materials. However, in other embodiments, the gates in the regions 50B and 50C may be formed by distinct processes, such that the gates may be made of different materials. Various masking steps may be used to mask and expose appropriate regions when using distinct processes.

Figure 22:
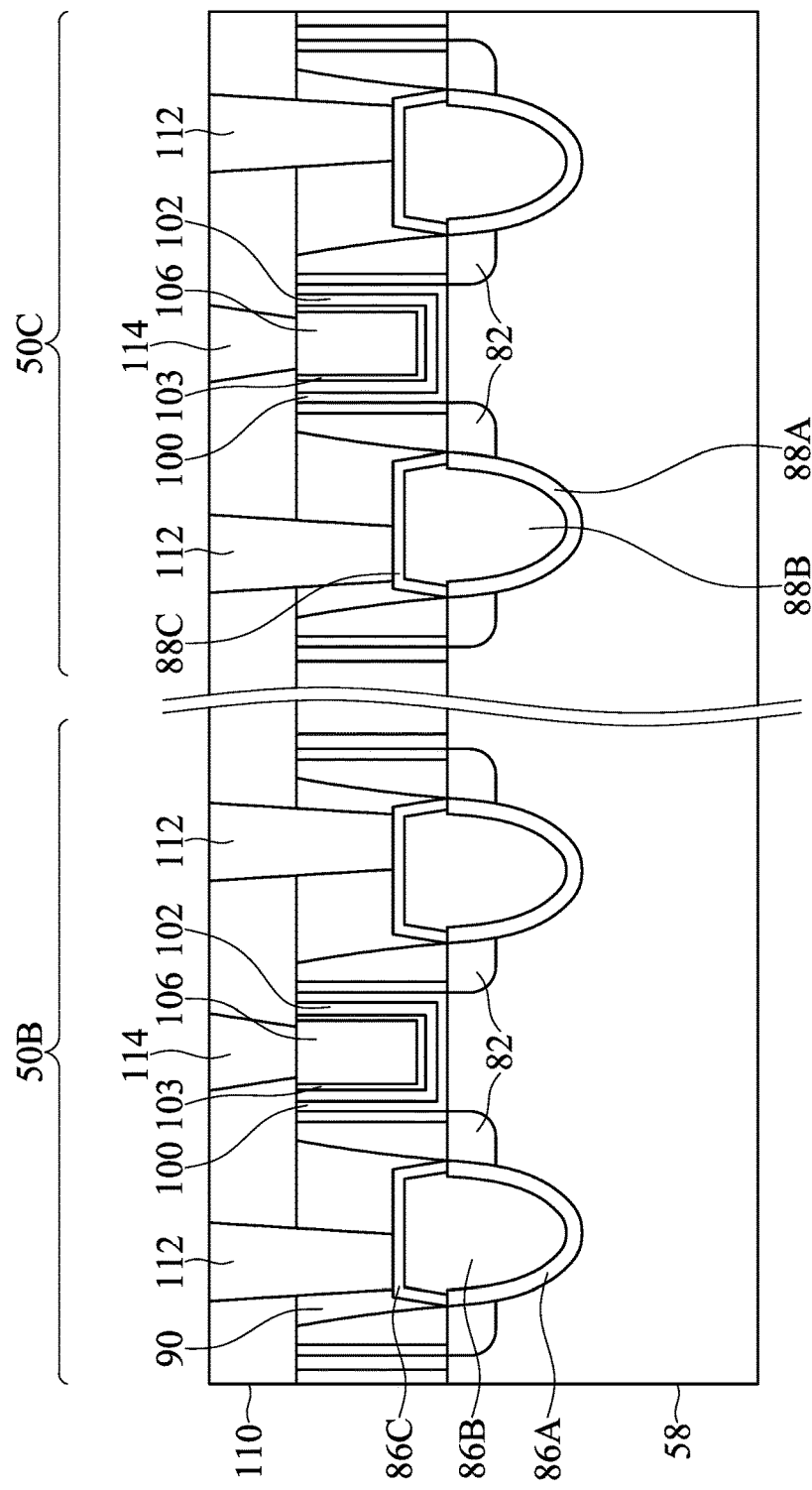

In FIG. 22, an ILD 110 is formed over the gate stacks and ILD 90. In an embodiment, the ILD 110 is a flowable film formed by a flow able CVD method. In some embodiments, the ILD 110 is formed of a dielectric material such as PSG, BSG, BPSG, USG, or the like, and may be deposited by any suitable method, such as CVD and PECVD.

Source/drain contacts 112 and gate contacts 114 are formed through the ILDs 90 and 110. Openings for the source/drain contacts 112 are formed through the ILDs 90 and 110, and openings for the gate contacts 114 are formed through the ILD 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 110. The remaining liner and conductive material form the source/drain contacts 112 and gate contacts 114 in the openings. An anneal process may be performed to form a silicide at the interface between the epitaxial source/drain regions 86 and 88 and the source/drain contacts 112. The source/drain contacts 112 are physically and electrically coupled to the epitaxial source/drain regions 86 and 88, and the gate contacts 114 are physically and electrically coupled to the gate electrodes 106. The source/drain contacts 112 and gate contacts 114 may be formed in different processes, or may be formed in the same process. Although shown as being formed in the same cross-sections, it should be appreciated that each of the source/drain contacts 112 and gate contacts 114 may be formed in different cross-sections, which may avoid shorting of the contacts.

Figure 23:
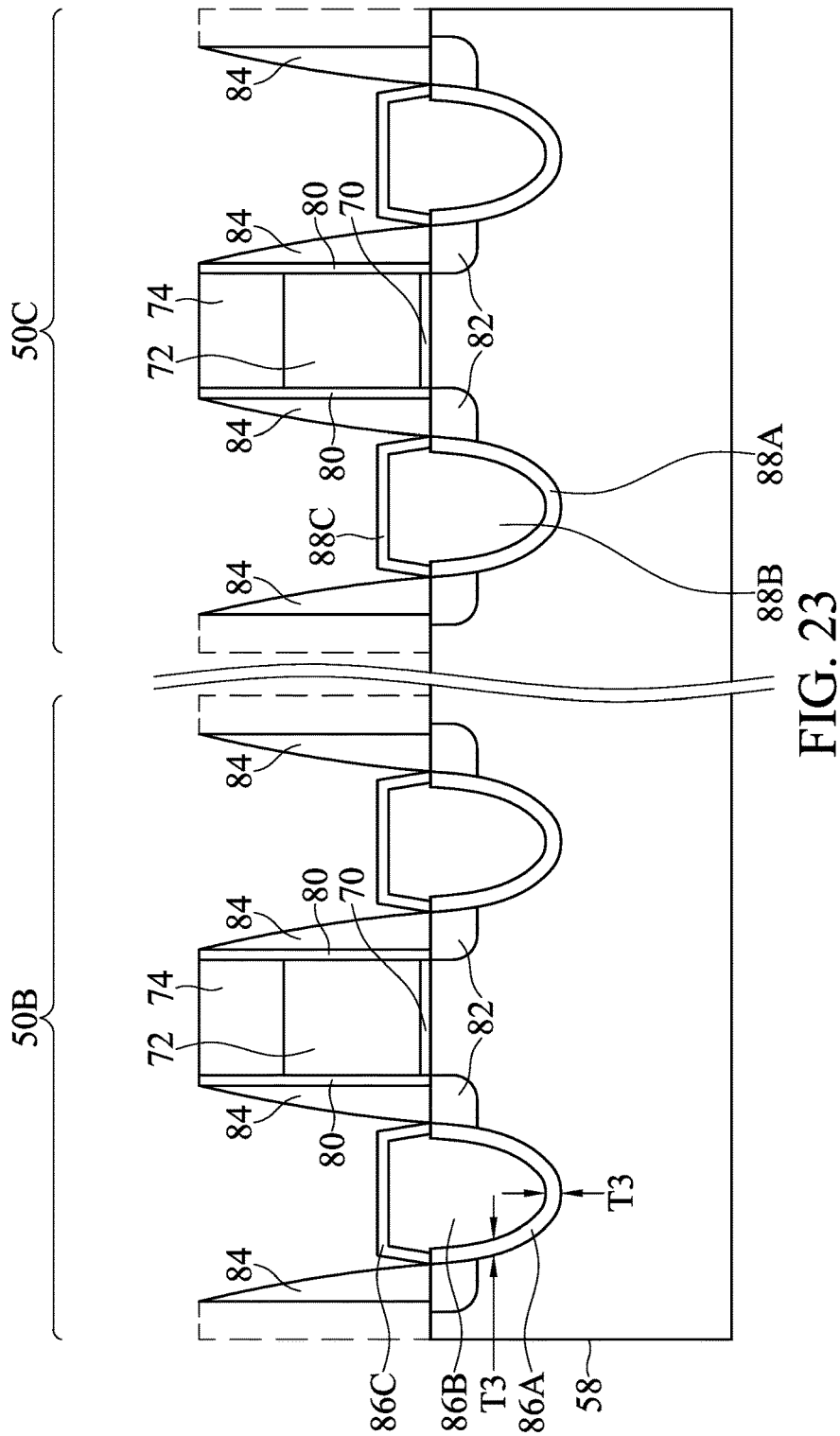
FIGS. 23 and 24 are cross-sectional views of intermediate stages in the manufacturing of FinFETs, in accordance with some embodiments.
Figure 24:
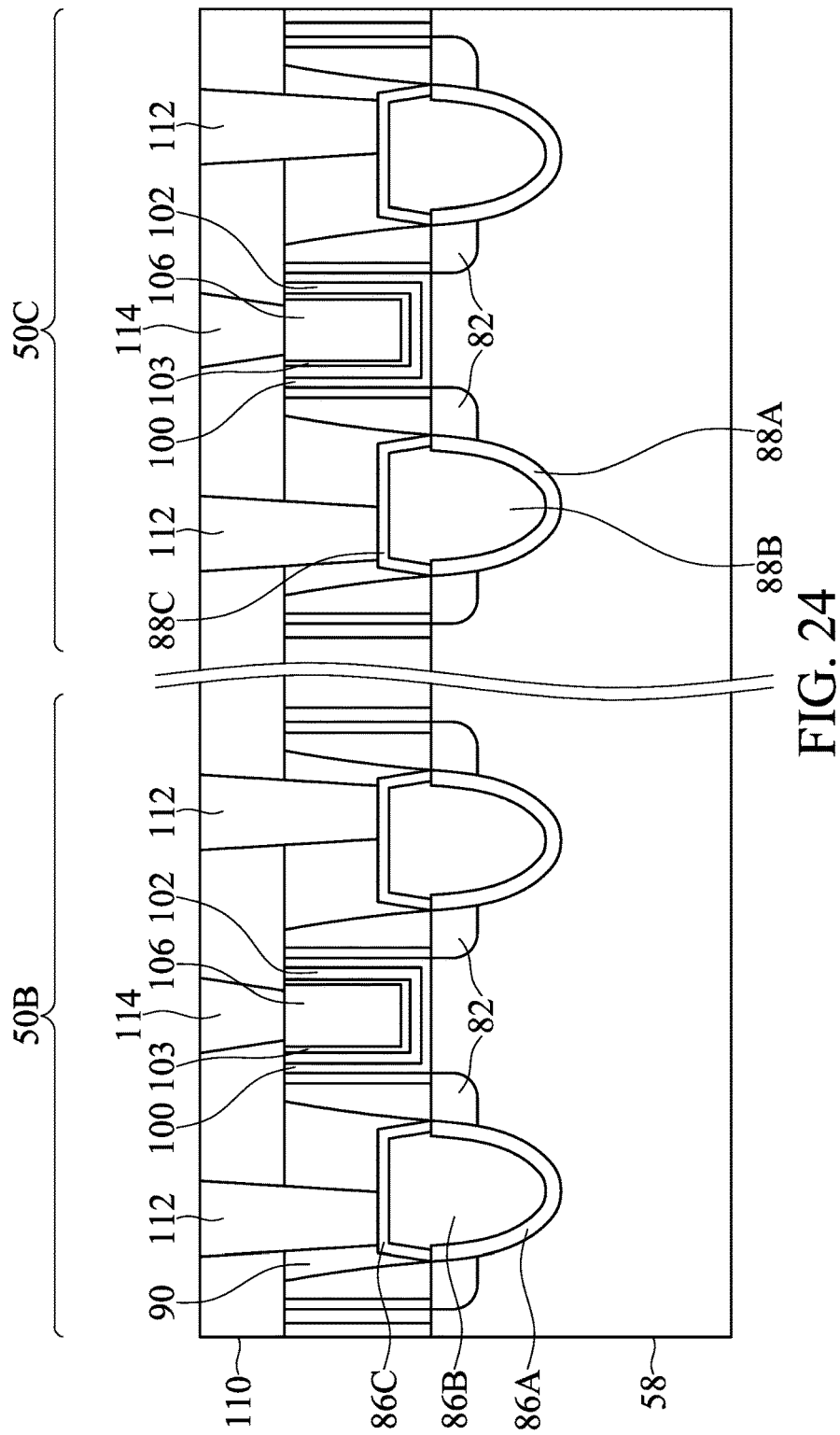

FIGS. 23 and 24 illustrate another configuration of the first layers 86A and 88A previously shown in FIG. 16. This embodiment is similar to the previous embodiment of FIGS. 1-22 except that in this embodiment, the first layers 86A and 88A have a substantially uniform thickness T3 on the sidewalls and bottom of the recesses 85 and 87. Details regarding this embodiment that are similar to those for the previously described embodiment will not be repeated herein.

FIG. 23 is an equivalent intermediate stage of processing as FIG. 16 (with the mask 89 of FIG. 16 removed) and the descriptions are not repeated herein. In FIG. 23, the first layer 86A may include SiC, SiCP, the like, or a combination thereof and the first layer 88A may include SiC, SiGeC, SiGeBC, the like, or a combination thereof. The first layers 86A and 88A may be epitaxially grown to line the recesses 85 and 87, respectively. The epitaxial processes may be begun by introducing the silicon precursor such as silane ($SiH_4$), dichlorosilane (DCS) ($SiH_4Cl_2$), or a combination thereof, and a carbon precursor such as methylsilane ($CSiH_6$) to the fin 58 in the recesses 85 and/or 87. In an embodiment the silicon precursor is introduced at a flow rate of from about 400 sccm to about 1200 sccm, such as about 850 sccm, while the carbon precursor is introduced at a flow rate from about 10 sccm to about 40 sccm, such as about 25 sccm. Further, the deposition may be performed at a temperature of from about 630° C. to about 710° C., such as about 700° C., and a pressure of between about 100 Torr and about 300 Torr, such as about 200 Torr. The flow rate of the carbon precursor is lower than in the previous embodiment. The first layers 86A and 88A may be formed to have an atomic concentration of carbon from about 0.2% to about 5%, such as about 3%. The first layer 86A (e.g., SiC and/or SiCP) in the region 50B and the first layer 88A (e.g., SiC, SiGeC, or SiGeBC) in the region 50C has a low etch rate to the etchants used during the removal of the dummy gate 72 and can help to protect the source/drain region 86 from being attacked and damaged during the dummy gate removal process.

As discussed in the previous embodiments, the source/drain regions 86 and 88 can be formed at different times and by different processes.

FIG. 24 illustrates further processing on the structure of FIG. 23. The processing between these two figures is similar to the processing illustrated and described above in reference to FIGS. 16 through 22 with FIG. 22 being an equivalent intermediate stage as FIG. 24 and the descriptions are not repeated herein.

FIGS. 25 through 28 illustrate another configuration of the source/drain regions 86 and 88 previously shown in FIGS. 1-22. This embodiment is similar to the previous embodiment of FIGS. 1-22 except that in this embodiment, the recesses 85 and 87 are formed by a two-step etch process including an anisotropic etch and an isotropic etch. Details regarding this embodiment that are similar to those for the previously described embodiment will not be repeated herein.

Figure 25:
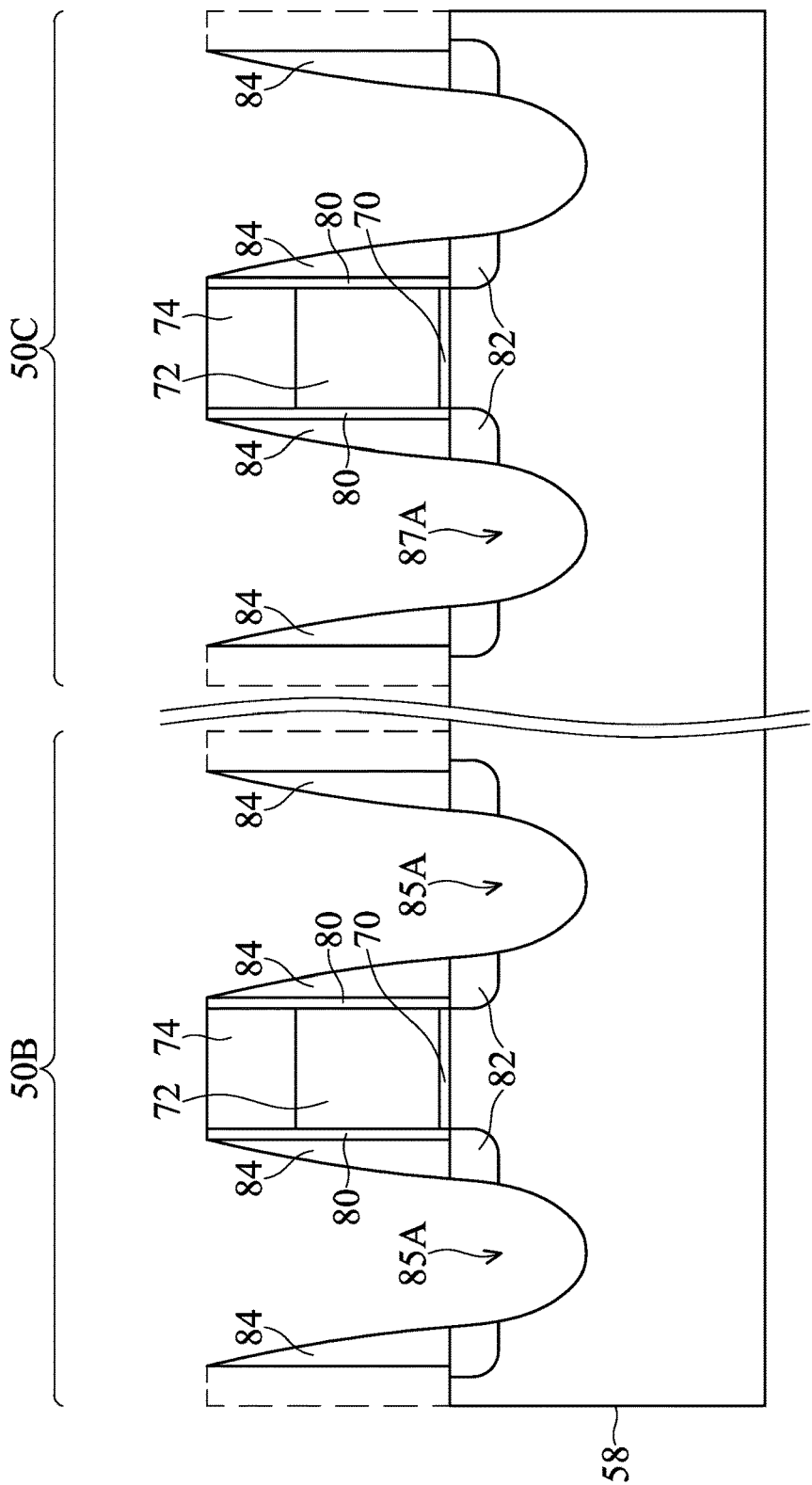
FIGS. 25, 26, 27, and 28 are cross-sectional views of intermediate stages in the manufacturing of FinFETs, in accordance with some embodiments.
Figure 26:
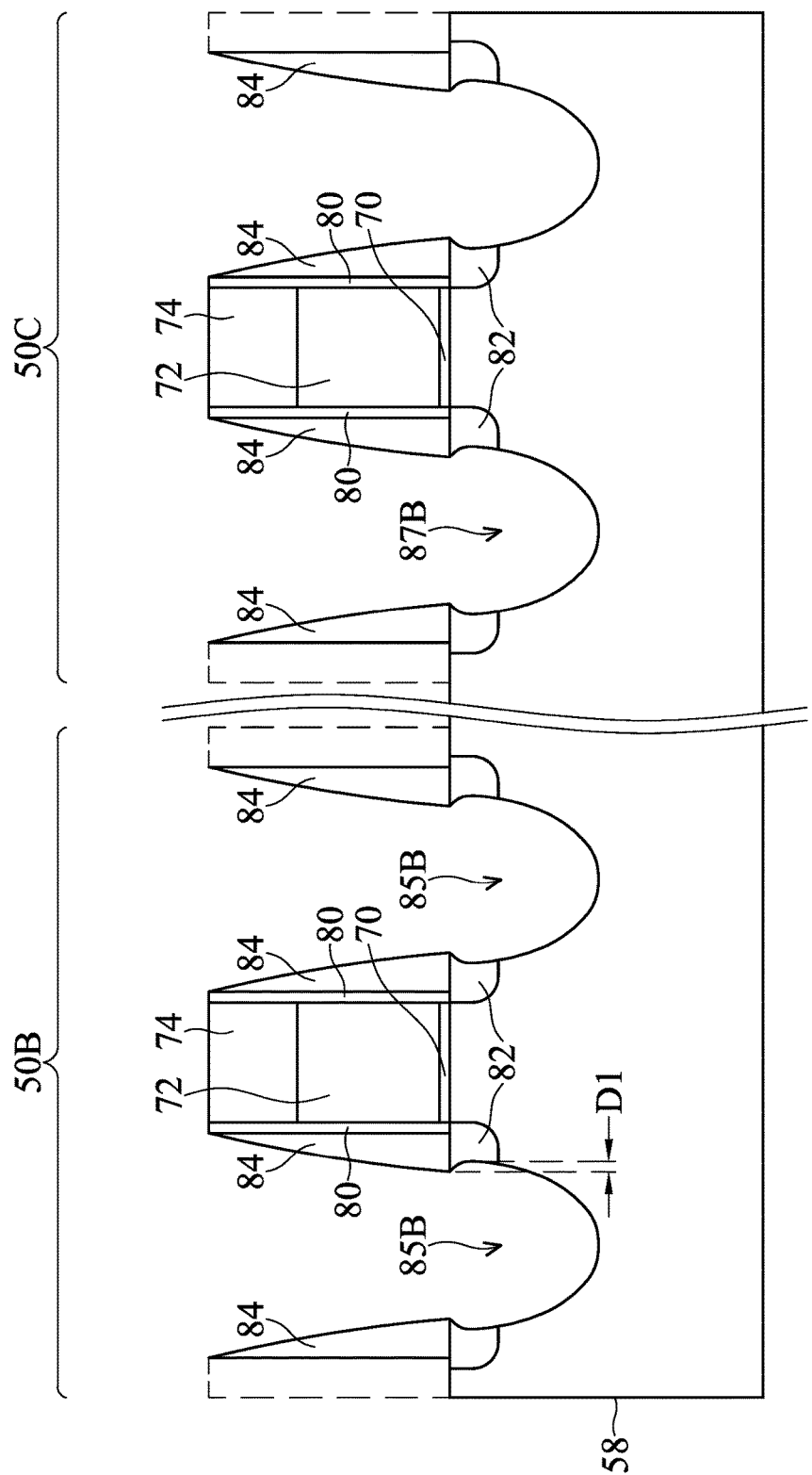

FIG. 25 is an equivalent intermediate stage of processing as FIG. 9 (except that in FIG. 25 both recesses 85A and 87A are illustrated as being formed simultaneously) and the descriptions are not repeated herein. In FIG. 25, the recesses 85A and 87A are equivalent to the recesses 85 and 87 described above and formed by the first anisotropic etch process. FIG. 26 illustrates further processing on the structure of FIG. 25. Although FIGS. 25-27 illustrate the source/drain regions 86 and 88 being formed simultaneously, as discussed in the previous embodiments, the source/drain regions 86 and 88 can be formed at different times and by different processes.

In FIG. 26, a second etch process is performed on the recesses 85A and 87A to form recesses 85B and 87B. The second etch process may be an isotropic wet etch process. In some embodiments, the isotropic etching process may be performed using a process gas mixture including $Cl_2$, $NF_3$, a combination thereof, or the like. After the second etch process, the sidewalls of the recesses 85B and 87B extend laterally a distance D1 under the outer sidewalls of the gate spacers 84. In some embodiments, the distance D1 is in a range from about 0.3 nm to about 5 nm. This second etch process can increase the volume of the epitaxial source/drain regions 86, which may increase the mobility of the FinFET.

Figure 27:
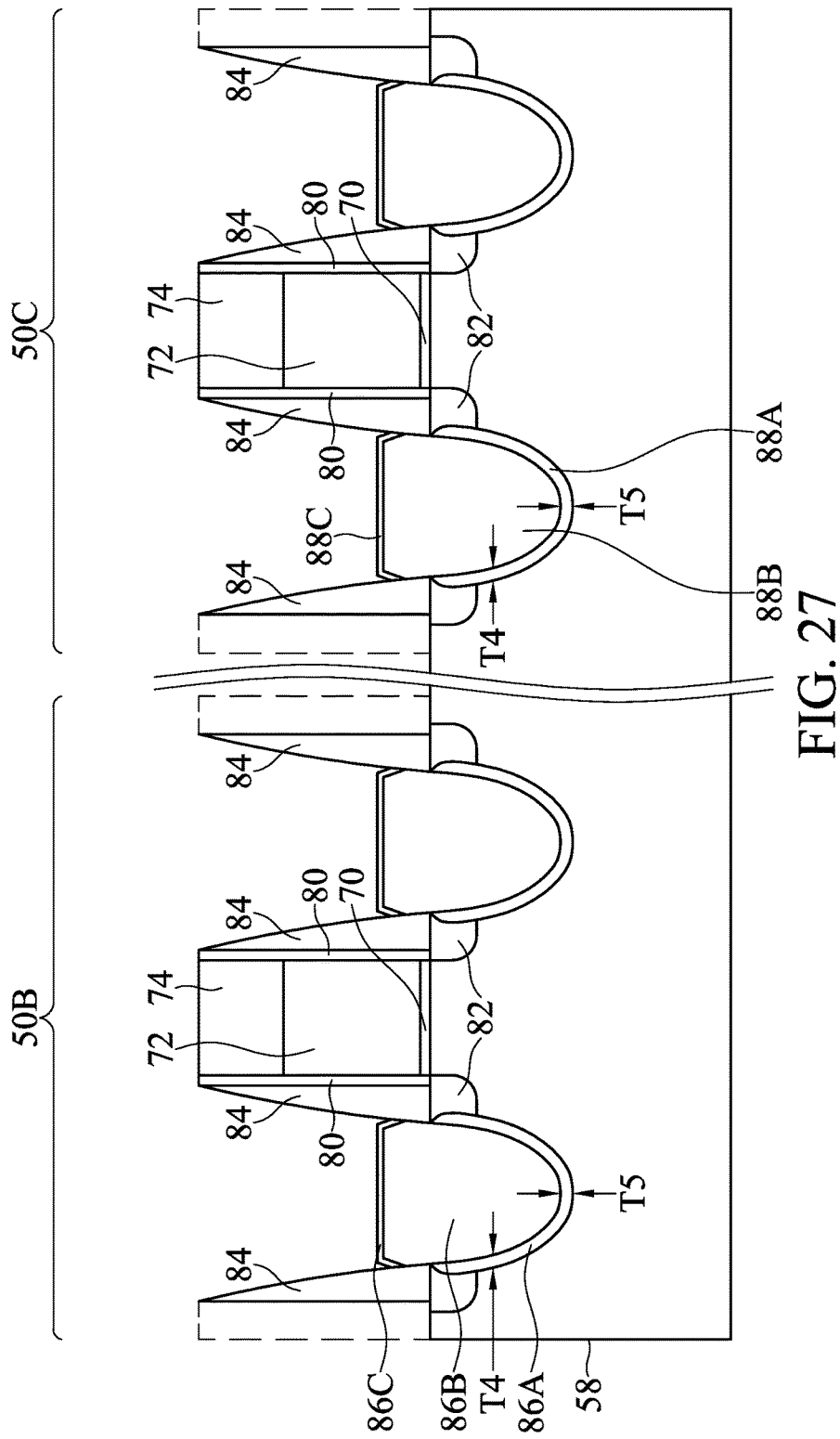

FIG. 27 illustrates further processing on the structure of FIG. 26. The processing between these two figures is similar to the processing illustrated and described above in reference to FIGS. 8 through 16 with FIG. 27 being an equivalent intermediate stage as FIG. 26 and the descriptions are not repeated herein.

As illustrated in the FIG. 27, the first layers 86A and 88A have thicknesses T4 at the sidewalls of the recesses 85B and 87B and thicknesses T5 at the bottom of the recesses 85B and 87B. In some embodiments, the thickness T4 is in a range from about 3 nm to about 12 nm, and the thickness T5 is in a range from about 3 nm to about 12 nm. The thicknesses T4 and T5 in this embodiment can be larger than the thicknesses T1 and T2 of the prior embodiment due to the larger volume of source/drain regions. In this embodiment, the epitaxial process to form the first layers 86A and 88A may be longer than the epitaxial process to form the first layers 86A and 88A of the previous embodiment due to the larger volume of the recesses 85B and 87B from the second etch process. In some embodiments, the ratio of the thicknesses T4/T5 is in a range from about 0.3 to about 1.3. The thickness T4 being between 3 nm and 12 nm at the sidewalls is of sufficient thickness to provide protection from the wet etch during the removal of the dummy gate while also not being too thick to significantly reduce the volume of the second layers 86B and 88B as the second layers 86B and 88B can be used as a stressor to strain the channel region of the device.

The second layers 86B and 88B may be epitaxially grown on the first layers 86A and 88A to fill the remaining portions of the recesses 85B and 87B. The second layers 86B and 88B of the epitaxial source/drain regions 86 and 88 in the regions 50B and 50C may have surfaces raised from respective surfaces of the fins 58 and may have facets. In this embodiment, the epitaxial process to form the second layers 86B and 88B may be longer than the epitaxial process to form the second layers 86B and 88B of the previous embodiment due to the larger volume of the recesses 85B and 87B from the second etch process.

Figure 28:
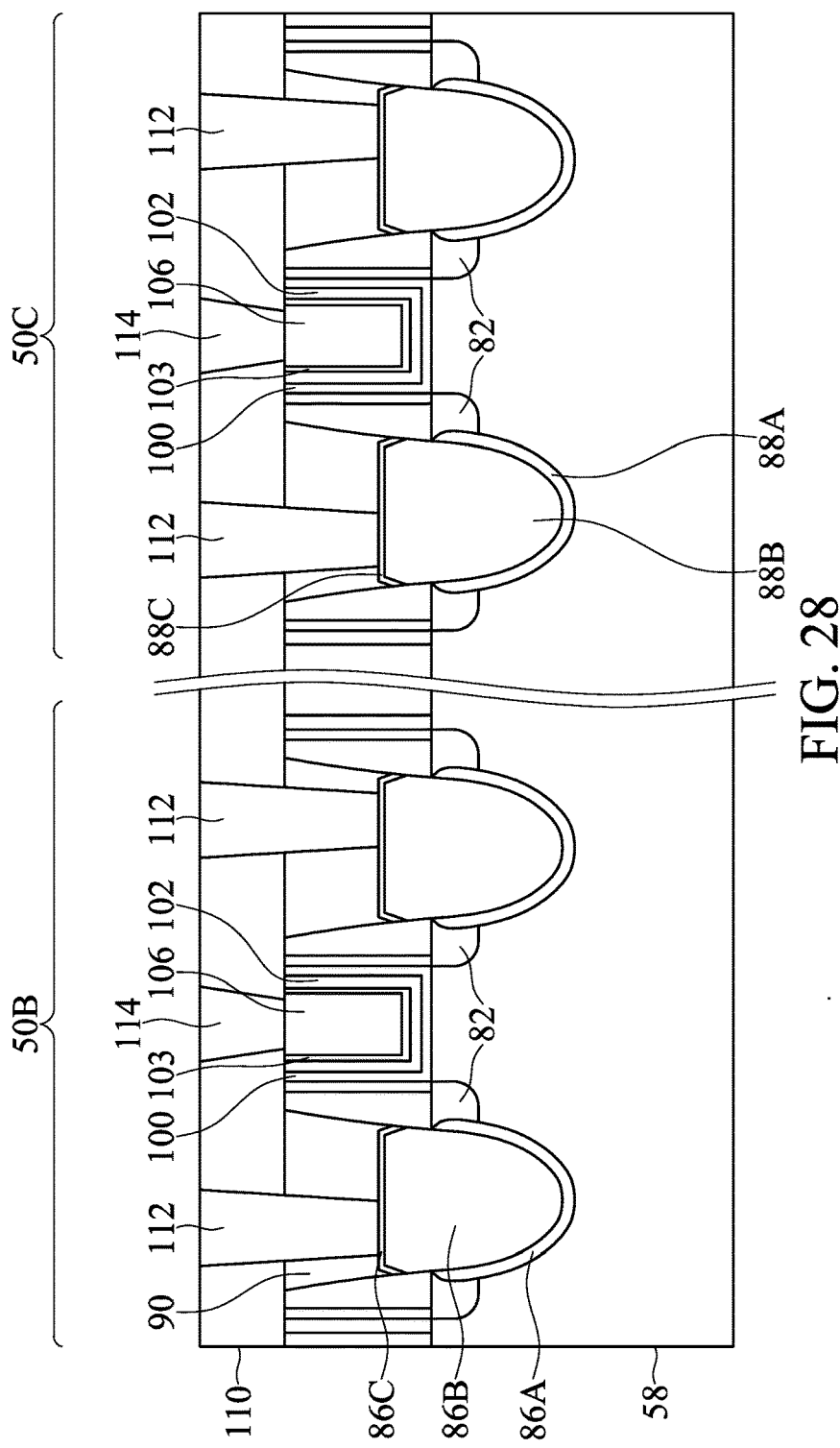

FIG. 28 illustrates further processing on the structure of FIG. 27. The processing between these two figures is similar to the processing illustrated and described above in reference to FIGS. 16 through 22 with FIG. 28 being an equivalent intermediate stage as FIG. 22 and the descriptions are not repeated herein.

Embodiments may achieve advantages. The disclosed embodiments improve the reliability of FinFET devices by widening the process window for the dummy gate removal process. In conventional FinFETs, a defect or break in the sidewall spacer could allow for the etchants used during the removal of the dummy gate to attack and damage the source/drain region. In the disclosed embodiments, the source/drain regions include a first layer 86A that has a low etch rate to the etchants used during the removal of the dummy gate to protect the source/drain region from being attacked and damaged during the dummy gate removal process. For example, if there were a defect or break in the gate seal spacer 80 and/or gate spacer 84, the first layer 86A, which has a low etch rate to the etchants used, would protect the second layer 86B from being attacked and damaging the source/drain region 86 during the dummy gate removal process. If the source/drain region 86 were to be damaged during the dummy gate removal process, the subsequent formation of the replacement gate could allow metal of the replacement gate to extrude through the defect and into the damaged area of the source/drain region. This extruded gate portion could short the gate to the source/drain region and render the device non-functional.

An embodiment is a device including a first fin extending from a substrate, a first gate stack over and along sidewalls of the first fin, a first gate spacer disposed along a sidewall of the first gate stack, and a first epitaxial source/drain region in the first fin and adjacent the first gate spacer. The first epitaxial source/drain region including a first epitaxial layer on the first fin, the first epitaxial layer including silicon and carbon, a second epitaxial layer on the first epitaxial layer, the second epitaxial layer having a different material composition than the first epitaxial layer, the first epitaxial layer separating the second epitaxial layer from the first fin, and a third epitaxial layer on the second epitaxial layer, the third epitaxial layer having a different material composition than the first epitaxial layer.

Embodiments may include one or more of the following features. The device where the first epitaxial layer has a uniform thickness at sides and a bottom of the first epitaxial source/drain region. The device where the first epitaxial layer is thicker at a bottom than at sides of the first epitaxial source/drain region. The device where the first epitaxial layer has an atomic concentration of carbon in a range from 0.2% to 5%. The device where the second epitaxial layer has a faceted top surface, and where the third epitaxial layer has a uniform thickness on the faceted top surface of the second epitaxial layer. The device where the third epitaxial layer contacts the first epitaxial layer and the first gate spacer. The device further including a second fin extending from the substrate, a second gate stack over and along sidewalls of the second fin, a second gate spacer disposed along a sidewall of the second gate stack, and a second epitaxial source/drain region in the second fin and adjacent the second gate spacer, the second epitaxial source/drain region having a different material composition than the first epitaxial source/drain region. The device where the first epitaxial source/drain region extends under the first gate spacer.

In an embodiment, a method includes depositing a first dummy gate over and along sidewalls of a first fin extending upwards from a substrate, forming a first gate spacer along a sidewall of the first dummy gate, forming a first recess in the first fin adjacent the first gate spacer, and forming a first source/drain region in the first recess, the forming the first source/drain region including epitaxially growing a first layer in the first recess, the first layer including silicon and carbon, epitaxially growing a second layer on the first layer, the second layer having a different material composition than the first layer, the first layer separating the second layer from the first fin, and epitaxially growing a third layer on the second layer, the third layer having a different material composition than the first layer.

Embodiments may include one or more of the following features. The method where forming the first recess includes performing an anisotropic etch process on the first fin, where after the anisotropic etch process, the first recess does not extend under the first gate spacer. The method where forming the first recess includes performing an anisotropic etch process on the first fin, and after the anisotropic etch process, performing an isotropic etch process on the first fin, where after the isotropic etch process, the first recess extends under the first gate spacer. The method further including replacing the first dummy gate with a functional gate stack disposed over and along sidewalls of the first fin. The method further including forming a lightly-doped drain region at an upper surface of the first fin, where the first recess extends through the lightly-doped drain region, and where the first layer extends along the lightly-doped drain region. The method where the first layer has a uniform thickness at sides and a bottom the first recess. The method where the first layer is thicker at a bottom than at sides of the first recess. The method where the second layer has a faceted top surface raised above an upper surface of the first fin, and where the third layer has a uniform thickness on the faceted top surface of the second layer.

In an embodiment, a method includes forming a first dummy gate over and along sidewalls of a first fin extending upwards from a substrate, forming a first gate spacer along a sidewall of the first dummy gate, anisotropically etching a first recess in the first fin adjacent the first gate spacer, epitaxially growing a first source/drain region in the first recess, the first source/drain region including a first epitaxial carbon-containing layer, a second epitaxial layer, and a third epitaxial layer, the first epitaxial carbon-containing layer lining the first recess, the second epitaxial layer being on the first epitaxial carbon-containing layer, the second epitaxial layer having a different material composition than the first epitaxial carbon-containing layer, and the third epitaxial layer being on the second epitaxial layer, the third epitaxial layer having a different material composition than the first epitaxial carbon-containing layer, and replacing the first dummy gate with a functional gate stack disposed over and along sidewalls of the first fin.

Embodiments may include one or more of the following features. The method further including anisotropically etching a first recess, performing an isotropic etch process on the first recess, where after the isotropic etch process, the first recess extends under the first gate spacer. The method where the first epitaxial carbon-containing layer of the first source/drain region prevents material of the functional gate stack from extending into the first source/drain region. The method where the first epitaxial carbon-containing layer is thicker at a bottom than at sides of the first recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a first dummy gate over and along sidewalls of a first fin extending upwards from a substrate;
    forming a first gate spacer along a sidewall of the first dummy gate;
    forming a first recess in the first fin adjacent the first gate spacer; and
    forming a first source/drain region in the first recess, the forming the first source/drain region comprising:
        epitaxially growing a first layer in the first recess, the first layer comprising silicon and carbon;
        epitaxially growing a second layer on the first layer, the second layer having a different material composition than the first layer, the first layer separating the second layer from the first fin; and
        epitaxially growing a third layer on the second layer, the third layer having a different material composition than the first layer.

2. The method of claim 1, wherein forming the first recess comprises:
    performing an anisotropic etch process on the first fin, wherein after the anisotropic etch process, the first recess does not extend under the first gate spacer.

3. The method of claim 1, wherein forming the first recess comprises:
    performing an anisotropic etch process on the first fin; and
    after the anisotropic etch process, performing an isotropic etch process on the first fin, wherein after the isotropic etch process, the first recess extends under the first gate spacer.

4. The method of claim 1 further comprising:
    replacing the first dummy gate with a functional gate stack disposed over and along sidewalls of the first fin.

5. The method of claim 1 further comprising:
    forming a lightly-doped drain region at an upper surface of the first fin, wherein the first recess extends through the lightly-doped drain region, and wherein the first layer extends along the lightly-doped drain region.

6. The method of claim 1, wherein the first layer has a uniform thickness at sides and a bottom of the first recess.

7. The method of claim 1, wherein the first layer is thicker at a bottom than at sides of the first recess.

8. The method of claim 1, wherein the second layer has a faceted top surface raised above an upper surface of the first fin, and wherein the third layer has a uniform thickness on the faceted top surface of the second layer.

9. A method comprising:
    forming a first dummy gate over and along sidewalls of a first fin extending upwards from a substrate;
    forming a first gate spacer along a sidewall of the first dummy gate;
    anisotropically etching a first recess in the first fin adjacent the first gate spacer;
    epitaxially growing a first source/drain region in the first recess, the first source/drain region comprising a first epitaxial carbon-containing layer, a second epitaxial layer, and a third epitaxial layer, the first epitaxial carbon-containing layer lining the first recess, the second epitaxial layer being on the first epitaxial carbon-containing layer, the second epitaxial layer having a different material composition than the first epitaxial carbon-containing layer, and the third epitaxial layer being on the second epitaxial layer, the third epitaxial layer having a different material composition than the first epitaxial carbon-containing layer; and
    replacing the first dummy gate with a functional gate stack disposed over and along sidewalls of the first fin.

10. The method of claim 9 further comprising:
    after anisotropically etching the first recess, performing an isotropic etch process on the first recess, wherein after the isotropic etch process, the first recess extends under the first gate spacer.

11. The method of claim 9, wherein the first epitaxial carbon-containing layer of the first source/drain region prevents material of the functional gate stack from extending into the first source/drain region.

12. The method of claim 9, wherein the first epitaxial carbon-containing layer is thicker at a bottom than at sides of the first recess.

13. A method comprising:
    forming a first gate over and along sidewalls of a first fin, the first fin extending from a substrate;
    forming a first gate spacer along a sidewall of the first gate;
    etching a first recess in the first fin adjacent the first gate spacer; and
    epitaxially growing a first layer in the first recess, the first layer comprising silicon and carbon;
    epitaxially growing a second layer on the first layer, the second layer having a faceted top surface, the second layer having a different material composition than the first layer, the first layer completely separating the second layer from the first fin; and
    epitaxially growing a third layer on the second layer, the third layer having a uniform thickness on the faceted top surface of the second layer, the third layer having a different material composition than the first layer.

14. The method of claim 13, wherein the first layer has a uniform thickness at sides and a bottom of the first recess.

15. The method of claim 13, wherein the first layer is thicker at a bottom of the first recess than at sides of the first recess.

16. The method of claim 13, wherein the first layer has an atomic concentration of carbon in a range from 0.2% to 5%.

17. The method of claim 13, wherein the third layer contacts the first layer and the first gate spacer.

18. The method of claim 13 further comprising:
    after epitaxially growing the third layer, replacing the first gate with a second gate disposed over and along sidewalls of the first fin.

19. The method of claim 13, wherein etching the first recess comprises:
    performing an anisotropic etch process on the first fin; and
    after the anisotropic etch process, performing an isotropic etch process on the first fin, wherein after the isotropic etch process, the first recess extends under the first gate spacer.

20. The method of claim 13, wherein the first layer extends under the first gate spacer.

* * * * *

UNITED STATES PATENT AND TRADEMARK OFFICE
CERTIFICATE OF CORRECTION

PATENT NO.       : 10,269,655 B1
APPLICATION NO.  : 15/993252
DATED            : April 23, 2019
INVENTOR(S)      : Yi-Jing Lee et al.

Page 1 of 1

It is certified that error appears in the above-identified patent and that said Letters Patent is hereby corrected as shown below:

On the Title Page

Item (72) Inventors, Line 1, delete "Yi-Jung Lee" and insert --Yi-Jing Lee--.

Signed and Sealed this
Sixteenth Day of July, 2019

Andrei Iancu
*Director of the United States Patent and Trademark Office*